United States Patent [19]
von der Embse

[11] Patent Number: 4,689,806
[45] Date of Patent: Aug. 25, 1987

[54] RECEIVER MODE CONTROL FOR ACQUIRING AND TRACKING A SIGNAL

[75] Inventor: U. A. von der Embse, Westchester, Calif.

[73] Assignee: Hughes Aircraft Company, Los Angeles, Calif.

[21] Appl. No.: 549,696

[22] Filed: Nov. 7, 1983

[51] Int. Cl.⁴ .......................... H04L 7/04; H03D 3/24; H04J 3/06
[52] U.S. Cl. .................................... 375/111; 375/119; 375/120; 370/104
[58] Field of Search ................. 375/111, 119, 120, 97; 455/12; 370/104

[56] References Cited

U.S. PATENT DOCUMENTS

| | | | |
|---|---|---|---|
| 3,564,424 | 5/1968 | Freeman et al. | 375/97 |
| 4,203,002 | 5/1980 | Nossen | 375/116 |
| 4,259,740 | 3/1981 | Snell et al. | 375/120 |
| 4,375,694 | 3/1983 | Kuhn | 375/120 |

Primary Examiner—Douglas W. Olms
Assistant Examiner—Wellington Chin
Attorney, Agent, or Firm—M. J. Meltzer; A. W. Karambelas

[57] ABSTRACT

A receiver is disclosed for acquiring and tracking a data signal in a highly stressed environment. The receiver comprises first and second I.F. sections, a mixer for translation from the first I.F. frequency to the second I.F. frequency, a 3 KHz bandpass filter at the second I.F. frequency, signal translator for synchronous translation of the signal at the second I.F. frequency to baseband, a digitizer for complex sampling operation on the baseband signal, a microprocessor for processing the digital samples, and a numerically controlled oscillator coupled to the mixer and controlled by the microprocessor. The microprocessor formulates matched digital discrete Fourier Transform filters which drive frequency, phase and symbol lock loops at the symbol rate. Each of the loop filters is formed by symbol-rate recursive, first-order equations. A novel mode control system is employed to implement an orderly transition through the receiver modes, comprising (i) out-of-band noise estimation, (ii) coarse frequency and time acquisition of the data signal employing a sequential probability ratio test and a handover process, (iii) frequency and symbol synchronization with the data signal, (iv) phase and symbol synchronization with the data signal, and (v) feedback loop lock confirmation. After loss of lock, the mode controller transfers the receiver operations back to the appropriate restart operation.

26 Claims, 32 Drawing Figures

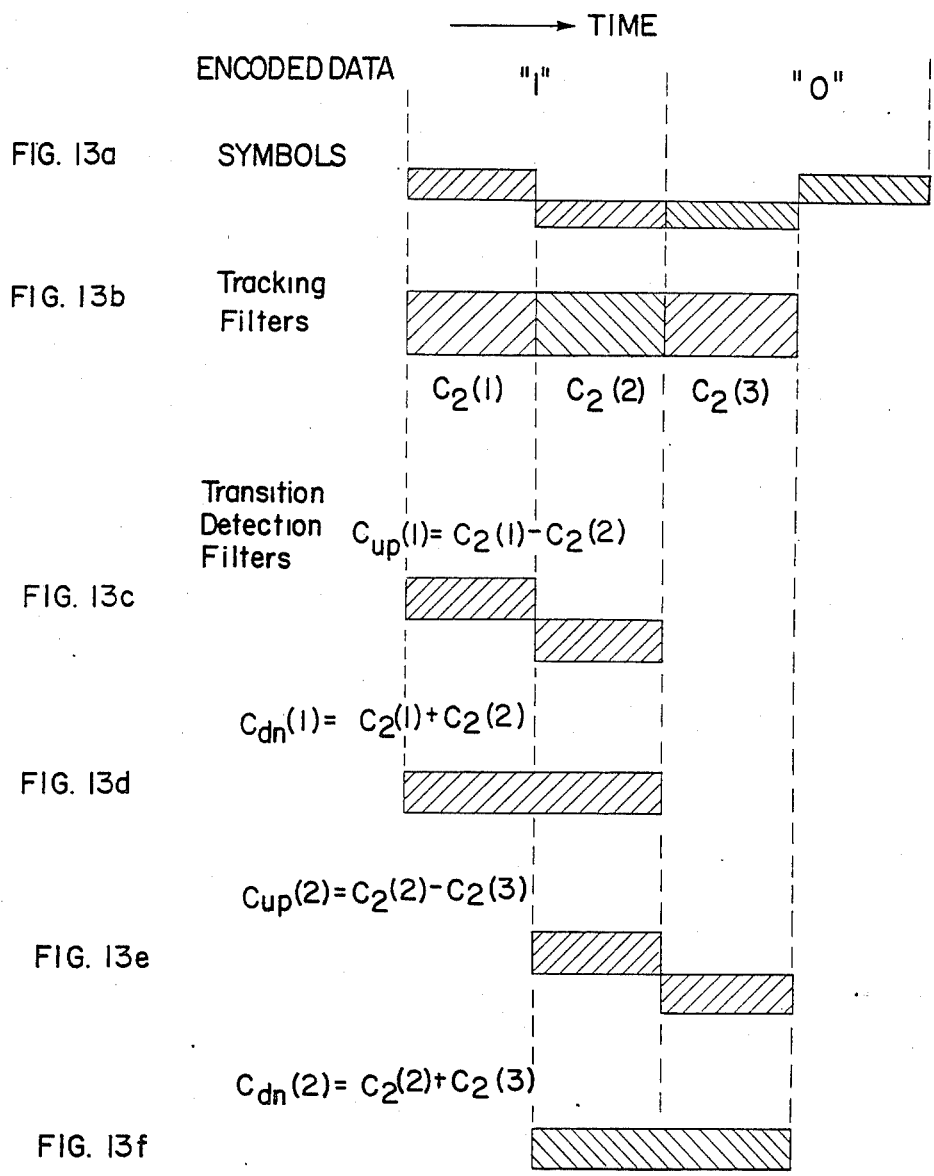

RECEIVER MODE CONTROL FOR ACQUIRING AND TRACKING A SIGNAL

This invention was made with Government support under Contract No. NAS 2-10000 awarded by the National Aeronautics and Space Administration. The Government has certain rights in this invention.

BACKGROUND OF THE INVENTION

1. Field of the Invention

The present invention relates to data communication links operating in a highly stressed environment, and more particularly to receivers operable in such links.

2. Description of the Prior Art

Data communications links sometimes are required to operate reliably in highly stressed environments, such as, for example, space vehicles and deployable probes employed in planetary exploration missions, communications satellites and other space vehicles providing communications links to ground stations and the like. The link may be disturbed by such phenomena as amplitude and phase scintillation, atmospheric absorption, wind gusts and turbulence, probe or spacecraft gain, oscillator drift, Doppler effect, and Doppler rate and noise variations. Receivers utilized in such highly stressed environments may be required to acquire and track data signals impressed with these disturbances as soon as possible in order that data demodulation may then occur.

The present invention relates to receivers operable in such highly stressed environments. Because such receivers are utilized in space missions which are not only very expensive, but may take several years to complete from vehicle launch to mission completion, the performance and reliability requirements may be extremely rigid. State-of-the-art acquisition and demodulation techniques and receivers are understood not to be capable of meeting these rigid performance and reliability criteria in a fully satisfactory manner.

SUMMARY OF THE INVENTION

The present invention relates to a receiver adapted to operate in highly stressed environments to quickly acquire and track a signal to demodulate data carried by the signal.

Signal acquisition begins with an SPRT (sequential probability ratio test) search of the frequency uncertainty band. It is implemented by sweeping the band with a 4-point DFT (discrete Fourier transform) filter bank. Each filter is matched to the 512 Hz Manchester symbol rate which is twice the coded symbol rate $1/T = 256$ Hz, so that the bandwidth covered by the filter bank is 1536 Hz. Two filter sets separated by T/2 offset are formed at the Manchester symbol rate. At each dwell, the DFT filter outputs are accumulated and compared with the SPRT thresholds until it is decided that the signal is or is not present. After the signal is detected, the residual 1536 Hz frequency uncertainty is too large to permit FLL (frequency lock loop) startup so a handover procedure is initiated to narrow the uncertainty band to 512 Hz. In handover, multiple DFT filters are formed to cover the frequency and time uncertainty region. Outputs are accumulated and the filter with the largest sum is chosen. The chosen filter center frequency and time offset estimates the signal location if, in addition, the sum passes a NeymanPearson false alarm threshold test. Following handover, the FLL and symbol lock loop (SLL) are initiated. The FLL tracks the frequency and allows implementation of a least-squares estimate of the frequency and frequency rate. These estimates are calculated at the end of the FLL operation and are used to start the PLL (phase lock loop). The SLL tracks the symbol timing. When the PLL is turned on, its bandwidth is opened wide to improve acquisition and gradually narrowed to its operating value under the control of the PLL lock detector statistic. After lock is confirmed by the other lock detectors, the demodulator output data is considered to be valid and telemetry data is measured.

In the preferred embodiment, the receiver is implemented by a hybrid analog digital system. This partitioning allows the novel communication techniques to be implemented in the programmable digital processor, comprising a microprocessor system. After being heterodyned to I.F., the input signal is mixed with the NCO (numerically controlled oscillator) output, bandwidth limited by a BPF (bandpass filter), and synchronously translated to baseband where it is digitized with 8 bit resolution. The resulting inphase and quadrature digital data streams are processed to form a set of 4-point Discrete Fourier (DFT) filters at the Manchester symbol rate $2/T = 512$ Hz. DFT outputs are used to form the tracking loop discriminants, lock detectors, and the symbol detection filter that provides the soft decision demodulator output.

A novel aspect of the receiver is that the FLL, PLL, SLL tracking loops operate at the symbol rate. FLL and PLL outputs drive the NCO and the SLL output drives the digital VCO. This VCO is a digital integrator whose output is a pointer that selects the start time for the DFT matched filters. Since the SLL is internal to the processor, the digitizer operates at 4 times the Nyquist rate of 2 kHz for the DFT filters. This enables the SLL to select the DFT timing at T/32 increments. Every T/2 seconds, the DFT filters are formed, and at T second intervals, the receiver state is updated. To improve the performance, the loop bandwidths for the FLL, SLL and PLL are opened wider at turn-on and then reduced with time.

While the overall receiver operation is disclosed, the present application is directed to the novel receiver mode control method and system. A receiver mode control method and system is disclosed for allowing a communications receiver to reliably acquire and track a data signal. The mode control system is an adaptive controller which implements an orderly transition through the receiver modes. The basic receiver modes comprise (i) out-of-band noise estimation, (ii) course frequency and time acquisition of the data signal employing a sequential probability ratio test and a handover process, (iii) frequency and symbol synchronization with the data signal, (iv) phase and symbol synchronization with the data signal, and (v) feedback loop lock confirmation. After loss of lock, the mode control transfers the receiver operation back to the appropriate restart mode.

Other features and improvements are disclosed.

BRIEF DESCRIPTION OF THE DRAWINGS

The above-mentioned and other features and objects of the present invention will become more apparent by reference to the following description, taken in conjunction with the followng drawings, where like reference numeral/denote like elements, and in which:

FIGS. 13a–13f are time domain charts illustrating the Manchester encoded BPSK data symbols and corresponding DFT tracking filters and transition detection filters.

DETAILED DESCRIPTION OF THE INVENTION

The present invention relates to a communications receiver adapted for acquisition, tracking and demodulation of a data signal in a highly stressed environment. The following description is presented to enable any person skilled in the art to make and use the invention, and is provided in the context of a particular application and requirements. Various modifications to the preferred embodiment will be readily apparent to those skilled in the art, and the generic principles defined herein may be applied to other embodiments. Thus, the present invention is not intended to be limited to the embodiment shown, but is to be accorded the widest scope consistent with the principles and novel features disclosed herein.

Table I illustrates exemplary disturbance phenomena which may exist in the highly stressed environments to which the preferred embodiment is adapted.

TABLE I

| Disturbance | Magnitude |
| --- | --- |
| Amplitude Scintillation | 0–3 db, .3 Hz Bw |
| Phase Scintillation | 0–3 rad., .01 Hz Bw |
| Atmospheric Absorption (Cloud) | 0–4 db |
| Wind Gusts and Turbulence | ±8 Hz over 4 to 32 sec. |
| Spin of Orbiter Vehicle/Probe | 7.5 radians/second |
| Oscillator Drift | 110 ppm |
| Doppler | ±35 kHz |
| Doppler Rate | −10 Hz/Sec |
| Noise Variation | 0–1 db |

The environment described in connection with the preferred embodiment should be regarded as exemplary only; the novel features and principles of the invention have utility in other applications and operating environments.

The data signal received by the preferred embodiment is convolutionally encoded with an $R=\frac{1}{2}$, $K=7$ soft-decision convolutional data coding, and transmitted at 128 bits per second (bps), 256 symbols per second, using suppressed-carrier, binary phase-shifted-keyed (BPSK) modulation. Manchester symbol coding is added to the transmitted signal. As is well known, Manchester coding comprises the division of each BPSK symbol of length T into two Manchester bits each of length T/2, the first and second bits having opposed binary values to create an artificial signal transition from one binary value to the other in the middle of the BPSK symbol, to minimize symbol lock loop tracking problems. The Manchester coding does introduce an ambiguity into the receiver symbol timing, i.e., whether symbol timing is based on the actual symbol transitions or on the Manchester bit transitions. The receiver must therefore include an ambiguity resolution mechanism to ensure that the symbol timing loop is properly locked on the actual symbol transitions.

Figure 1:
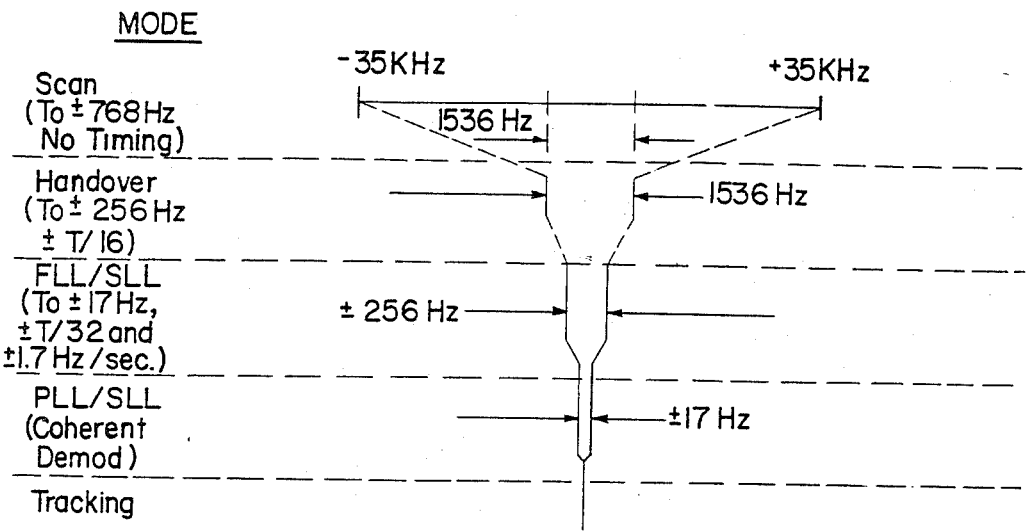
FIG. 1 is a schematic illustration of the signal acquisition, tracking and demodulation as achieved in accordance with the preferred embodiment of the invention.

The overall signal acquisition operation of the receiver of the preferred embodiment is illustrated in FIG. 1. The frequency of the data signal is within a ±35 kHz uncertainty band, and a scan operation is first performed to narrow the uncertainty band in which the data signal is located to a band only 1536 Hz wide. As a result of a "handover" operation, the uncertainty band is further narrowed to a band ±256 Hz, and the symbol timing is determined to within ±T/16.

Using a frequency lock loop and symbol lock loop operation, the receiver further narrows the uncertainty band to one only ±17 Hz wide, resolves the symbol timing to within ±T/32, and determines the signal frequency rate of change to within +1.7 Hz/seconds. At this point, the receiver operation shifts to a phase lock loop and symbol lock loop operation, and tracking and coherent demodulation of the data signal rapidly ensues.

This operation is accomplished in the preferred embodiment by a hybrid analog-digital implementation employing a microprocessor to perform digital filtering and processing functions. This receiver accomplishes the requirements for reliable rapid acquisition, reacquisition and tracking under severe link stresses and low C/No (signal power to noise power density ratio) operation and microprocessor computation limitations.

Figure 2:
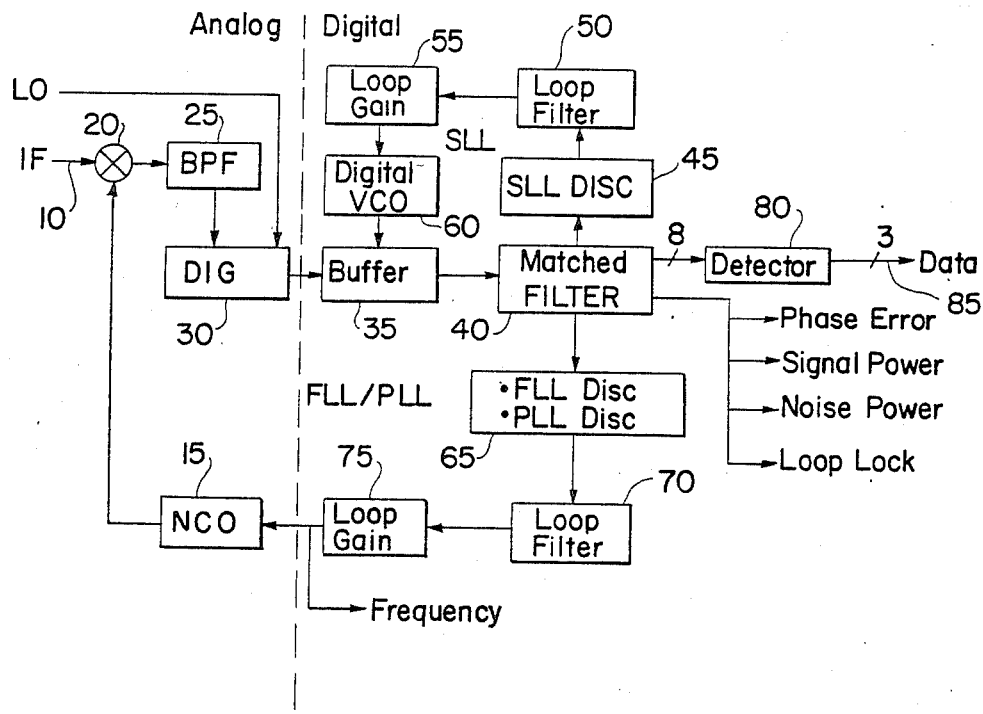
FIG. 2 is a block diagram illustrating the functions carried out by the preferred embodiment.

The simplified block diagram of FIG. 2 illustrates certain receiver functions implemented by the hybrid analog/digital structure, including the microprocessor. After being heterodyned to a first I.F. (intermediate frequency), the first I.F. signal 10 is mixed at mixer 20 with a numerically controlled oscillator (NCO) 15 signal for translation to a second I.F. frequency signal. The I.F. signal from mixer 20 is passed through bandpass filter 25 to digitizer 30. A local oscillator (LO) signal is also coupled to the digitizer 30 where it is used to quad mix the second I.F. signal to baseband prior to digitization. The digitizer 30 performs complex sampling (in-phase I and quadrature Q baseband sampling), with 8 bit resolution.

Still referring to FIG. 2, the in-phase and quadrature digital data streams are fed to buffer 35, and then processed to form a set of 4-point Discrete Fourier Transform (DFT) filters at the Manchester symbol rate (2/T=512 Hz). The matched filter 40 drives both the symbol lock loop (SLL) and the frequency lock loop/phase lock loop (FLL/PLL). While these loops will be discussed in greater detail below, the SLL is a second-order loop which uses the buffer 35 to reduce the symbol timing error to within plus-or-minus T/32, where T is the symbol period. The FLL is a secondorder loop which provides an estimate of the signal frequency.

The PLL tracks the phase of the baseband signal coherently. The FLL and PLL loops are closed through the feed-forward analog-to-digital (A/D) interface, and the feedback D/A interface via the numerically controlled oscillator (NCO).

In the SLL, the matched filter 40 is used to determine an SLL discriminant at discriminant 45. This discriminant is smoothed by second order loop filter 50, whose bandwidth decays linearly for the first 15 seconds during FLL operation and remains constant during PLL operation. The SLL output drives the digital voltage controlled oscillator (VCO). The VCO is a digital integrator whose output is a pointer which selects the start time for the DFT matched filter. The SLL is wholly internal to the microprocessor, with the digitizer 30 being operated at four times the Nyquist rate of 2 kHz for the IF filter 25 bandwidth. This enables the SLL to select the DFT timing at T/32 increments. Every T/2 seconds, the DFT filters are formed, and at T second intervals, the receiver state is updated. To improve the performance, the loop bandwidths for the FLL, PLL and SLL are opened wider at system turn-on and then reduced with time.

The FLL and PLL loops are also driven by matched filter 40. At discriminant 65, the microprocessor determines either a frequency (FLL) or phase (PLL) estimate discriminant which is smoothed by loop filter 70 and passed through amplifier 75 to form a loop output used to drive the numerically controlled oscillator (NCO) 15. The NCO output is fed to mixer 20, where it is mixed with the IF data signal to provide the second I.F. signal which is translated to baseband and digitized by digitizer 30.

It will be appreciated by those skilled in the art that the NCO output may be progressively swept through the frequency uncertainty band. The difference signal will be passed through filter 25, so that the 2 kHz frequency band through which the difference signal is to be passed may be correlated to a predetermined part of the uncertainty band.

Once the receiver has acquired and tracked the data signal, then the 8 bit matched filter 40 output is detected at detector 80 and the signal demodulated to provide a 3 bit data word.

Figure 3:
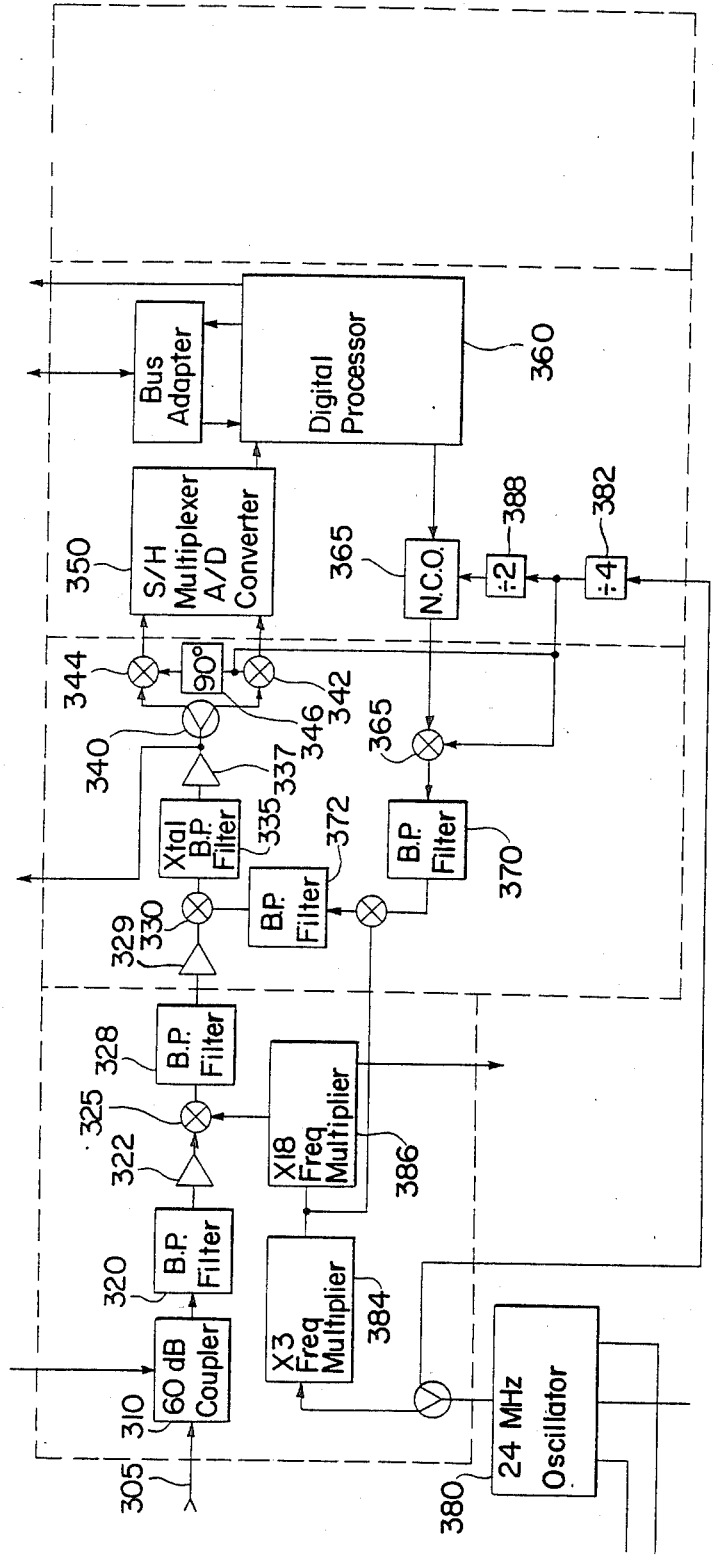
FIG. 3 is a functional block diagram of the receiver system of the preferred embodiment.

Referring now to FIG. 3, a block diagram of the preferred embodiment of the receiver is illustrated.

The RF data signal 305 is input to the receiver at a frequency of approximately 1387 MHz. The signal is passed through a coupler 310 to bandpass filter 320. The purpose of bandpass filter 320 is to reject a signal which is sent to a redundant receiver (not shown), and to limit the bandwidth. The signal from filter 320 passes through amplifier 322 to mixer 325, where a mixing operation takes place with the output from frequency multiplier 384. The output of mixer 325 is a first IF frequency signal which is passed to IF filter 328. IF filter 328 covers the frequency range over which the receiver must search and find a signal, and provides sufficient additional range to allow the receiver to make out-of-band noise power estimates $\hat{N}$ to initiate the SPRT.

The output of the filter 328 is passed through amplifier 329 to mixer 330, the first-to-second I.F. frequency mixer. Mixer 330 centers the second I.F. signal in the 2 kHz tracking filter, by mixing the first I.F. signal with a combination of a fixed frequency from the reference oscillator and the NCO output signal.

The output of mixer 330 is fed to crystal bandpass filter 335. Filter 335 comprises the second IF tracking filter, a 2 kHz bandpass filter used to limit the bandwidth seen by digitizer 350 and to center on the signal. The output of filter 335 is passed through amplifier 337 to signal splitter 340. The output of splitter 340 is fed to mixers 342 and 344. Mixers 342 and 344, respectively, are mixed with signals from the 24 MHz oscillator 380 which has been passed through signal frequency divider 382. Splitter 340, mixers 342 and 344, and 90° phase shifter 346 perform a quad mixing which is an "I/Q" synchronous translation of the tracking filter bandwidth to baseband. This translation generates I (inphase) and Q (quadrature) signal components at baseband.

At baseband, the 2 kHz signal Z(t) has the complex representation $Z(t)=I(t)+jQ(t)$, where Z(t) is the complex modulation function or envelope of the data signal from the tracking filter, which contains all the signal information. With this notation, I=Real (Z) and Q=Imaginary (Z).

The signal is centered at 1 kHz in alignment with the DFT tracking filters C2 and C4, described below. During phase-lock loop phase tracking, the signal is aligned with the I axis by the PLL.

Stable oscillator 380 provides the frequency and time reference signals from the receiver. The oscillator generates a 72.976659 mHz signal (for one receiver). It is passed through frequency multipliers 384 and 386, as well as frequency dividers 382 and 388.

Device 350 comprises the digitizer which performs quad mixing functions, sample-and-hold functions, multiplexer functions, and A/D conversion. In the preferred embodiment, the A/D converter is clocked at a sampling rate of 8192 Hz, four times the nominal bandwidth of filter 335. The A/D converter receives two baseband signals, the I and Q signals, and converts each signal to a serial binary data stream. The digital processor 360 comprises a microprocessor unit, and carries out programming and computing functions which are well known to those skilled in the art. The microprocessor design and implementation per se form no part of the present invention, and will not be described in further detail.

Numerically controlled oscillator (NCO) 365 is controlled by an output from a digital processor and converts the digital feedback signal from a digital tracking loop implemented in the microprocessor into a frequency which is proportional to the value of the digital feedback signal. This output in turn is mixed with a reference signal by mixer 367 and is provided through bandpass filters 370 and 372 to mixer 330.

The receiver signal flow will be readily apparent to those skilled in the art and, accordingly, need not be described in further detail.

A novel aspect of the receiver is that the SLL, FLL and PLL are driven at the symbol rate, 256 Hz, with digital matched filters in order to minimize microprocessor loading and to maximize performance. This is in contrast to the known prior art techniques which operate the loops at the Nyquist rate, 2 kHz, of the IF bandwidth seen by the loops. This prior art is summarized in the article "A Survey of Digital Phase-Locked Loops," by W. C. Lindsey and C. M. Ching, PROCEEDINGS OF THE IEEE, Vol. 69, No. 4, pp. 410–431, April 1981, and the IEEE Transactions on Communications, special issue on "Phase-Locked Loops," October 1982.

Another novel feature of the receiver is the implementation of the loop filters or integrators. Recognizing that the microprocessor software processing would enable ideal filtering, the first-order integration expressed in the Laplace domain as A/s is implemented in the time domain as the first-order recursive equation $$X(K+1) = X(K) + A*T*Y(K) \tag{1}$$

where $X(K+1)$, $X(K)$ are the loop outputs for symbols K, K+1, respectively, T is the symbol length, and $Y(K)$ is the input for symbol K from the discriminant driving the loop. Second order integration is implemented as a concatenation of the Equation 1. This finite difference integration technique comprises the loop filter model.

This recursive equation, Equation 1, provides a "state space" formulation, with the "sampling" taking place at the "symbol rate" and not the IF bandwidth rate as assumed by known "Z-transform" theory. This result follows since the matched filters serve to effectively reduce the "Nyquist rate bandwidth" from the IF bandwidth to the symbol bandwidth which is identically equal to the symbol rate for matched filtering.

The net result of the use of this novel first-order recursive equation in the implementation of the loop filters is the minimization of the microprocessor computational loading, in contrast to previously known techniques.

Another novel aspect of the receiver is that the dependency of the loop discriminants on the input signal amplitude "A" has been minimized to achieve discrimination which approaches the ideal. The "ideal" discrimination occurs when the FLL, SLL and PLL are respectively driven by estimates of the frequency, timing and phase tracking errors which are essentially linear and independent of the signal input amplitude. To implement this aspect, each of the loop discriminants is normalized by the recursive estimate $\hat{A}$ of the signal amplitude A, i.e., the discriminant is divided by $\hat{A}$ or $(\hat{A})^2$, as appropriate for first or second-order loops.

The value of $\hat{A}$ is derived using the recursive equation $$\hat{A}(K) = \hat{A}(K-1) + \alpha(|C2| - \hat{A}(K-1)) \tag{2}$$

where $\hat{A}(K)$, $\hat{A}(K-1)$ comprise the amplitude estimates at symbols 37 K" and "K-1", respectively, $\alpha$ is the inverse of the number of symbols whose amplitude is being averaged, and $|C2|$ is the absolute value of the 4-point DFT filter C2 which tracks the signal and accumulates the energy at the "K−1" symbol.

This recursive equation has the advantages that (i) the value $(|C2| - \hat{A}(K-1))$ is a relatively small number, thereby minimizing word size, (ii) $\hat{A}(K+1)$ is computationally stable with time and accuracy of word size, and (iii) the calculation is computationally simple. Tests have displayed a performance of the bit-error-rate (BER) vs. signal-energy-per-bit-to-noise-power-density-ratio (Eb/No) performance which is less than 1 db from the optimum ideal performance for BPSK modulated signals.

Another novel feature of the receiver is the use of a matched filter comprising a bank of complex discrete Fourier Transform (DFT) filters formed by "add-only" algebraic operations and located at the center of the bandpass filter spectrum after it has been synchronously translated to baseband.

The use of matched filters to maximize receiver signal-to-noise ratio is well known to those skilled in the art, and need not be described in detail here. Since the signal amplitude has been normalized, the matched filter need only match the phase rotations in the signal. As will be described in more detail below, these DFT filters are formed with computationally simple, "add-only" operations.

The "add-only" DFT filters comprise 4-point filters which spectrally cover the complete IF bandwidth seen by the loops and also minimize the burden of calculating the loop discriminants, normalization coefficients, lock detectors and other data. "Add-only" in this context means that only "add" and "90°" rotation calculations are needed to form the DFT filters, i.e., that there are no multipliers involved.

Still another novel feature of the receiver is that the timing loop, the SLL, exists completely within the digital domain (i.e., within the microprocessor) to keep it asynchronous, i.e., independent, from the A/D conversion. There is no loop timing feedback either through the NCO or A/D converter, thereby providing the freedom to move the time reference forward or backward within the microprocessor to achieve "optimal" loop performance. This also minimizes the microprocessor loading, since the SLL digital VCO and its output can be implemented as simply a counter whose output selects the "starting address" of the 4-point DFT filters. This requires that the A/D converter be run at some multiple $K_{A/D} > 1$ of the Nyquist rate ($8/T = 2$ kHz for the inphase and quadrature components of the preferred embodiment) to keep the timing filter and timing offset errors within tolerable limits. The value $K_{A/D} = 4$ has been found to be adequate for the application of the preferred embodiment.

The above described novel features of the receiver allow it to accomplish the functions of signal acquisition, tracking and demodulation. A novel mode control system is implemented to control the operation of the receiver through its various modes of operation. The mode control system implements the orderly transition of receiver operation through five basic steps or modes: (1) out-of-band noise estimate; (2) coarse frequency and time acquisition, with a sequential probability ratio test (SPRT) and a handover algorithm; (3) frequency and symbol synchronization by the FLL and SLL; (4) phase and symbol synchronization by the PLL and SLL; and (5) lock confirmation and subsequent valid data demodulation.

The mode control system further implements an adaptive feedback procedure when loss-of-acquistion and/or loss-of-lock occurs. Each of the above modes and features will be described in more detail below, as will a detailed flow chart of the mode control system. To present an overview, FIG. 4 is a simplified flow chart illustrating the overall operational sequence of the receiver operations, as determined by the novel mode control system.

Figure 4:
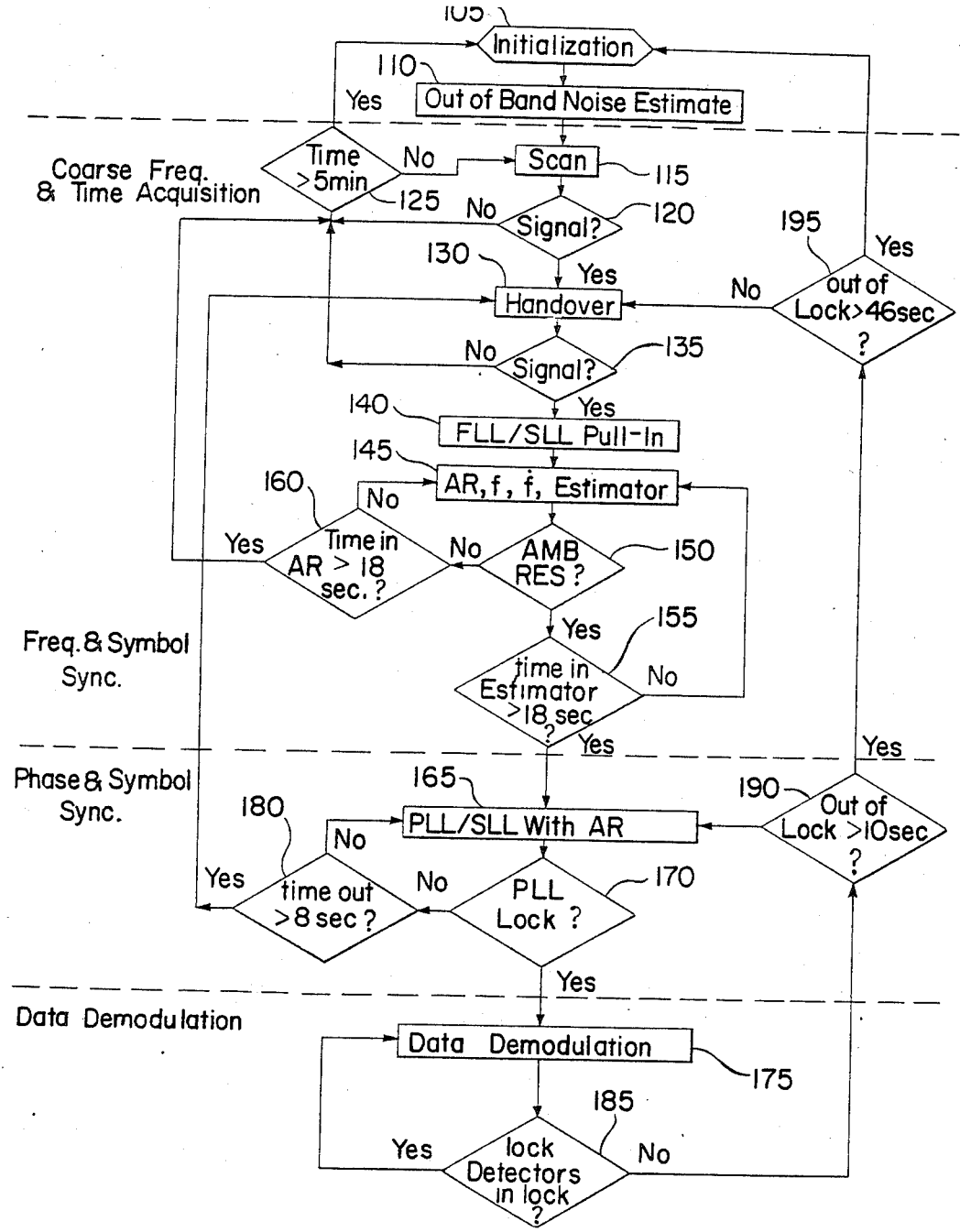
FIG. 4 is a simplified flow chart illustrative of the mode control system implemented in the preferred embodiment.

Referring now to FIG. 4, at step 105 the receiver is initialized, and at step 110 an estimate of the out-of-band noise energy is determined. The next step 115 is to perform the scan operation across the frequency uncertainty band using a sequential probability ratio test (SPRT), searching for the existence of signal. Step 120 is a decision point to decide if a signal was detected. If no signal was detected, then at step 125 a test is performed to determine whether five minutes has elapsed since calculating the out-of-band noise estimate. If not, the receiver operation reverts to the scan step 115 to scan the frequency uncertainty band again. If more than five minutes has elapsed, the receiver operation starts the initialization step 105 and determines another estimate of the out-of-band noise energy.

If at step 120 a signal has been detected, then at step 130 a "handover" operation occurs, wherein the receiver commences the transition from the SPRT scan to the FLL and SLL operation. At step 135, "FLL/SLL pull-in," the FLL and SLL start up, with loop parameters which decay from initial start-up values to parameters chosen for steady-state operation.

At step 145, values for the frequency f and frequency rate ḟ are estimated, using a least-squares estimation process. At step 150 a decision is made to determine whether the ambiguity has been resolved as to whether the SLL has locked onto the symbol or the Manchester bit transitions. If ambiquity resolution (AR) has been accomplished, then at step 155 a timer is checked to determine if the elapsed interval since commencing the estimation process at step 140 is longer than 18 seconds. If AR has not yet occurred, then at step 160 a timer is checked to determine if the elapsed interval since entering step 150 loop is longer than 18 seconds, and if not, the receiver operation back to step 145 to determine new f and ḟ estimates. If the timer at step 160 indicates an elapsed interval longer than 18 seconds, the program control shifts the operation back to decision point 125, to determine whether to commence a new scan of the uncertainty band with a new out-of-band energy estimate.

At step 155, if the elapsed interval since entering step 145 is longer than 18 seconds, then commencing at step 165, the receiver operation mode shifts to the phase and symbol synchronization mode. At step 170, a decision is performed to determine whether the PLL is in lock. If not, then at step 180, a timer is checked to determine whether the elapsed time interval since the out-of-lock condition commenced is longer than 8 seconds, and if not, the operation shifts back to repeat step 165. If the elapsed interval is greater than 8 seconds, then mode control shifts the receiver operation back to the SPRT handover operation at step 130.

At step 170, if the receiver is in phase lock, then the receiver is ready to commence valid data demodulation at step 175. All lock detectors, i.e., for the FLL, SLL and PLL, are periodically checked at step 185 to ascertain whether the receiver is still locked onto the signal. If not, then interval timers at decision points 190 and 195 determine, based upon the length of time the out-of-lock condition has persisted, whether receiver operation reverts back to step 165 (the PLL), step 130 (the FLL), or to step 105 (initialization).

The above simplified flow chart of FIG. 4 is illustrative of the overall receiver operations, which has been adapted to the particular application of the preferred embodiment. The flow chart does exemplify the powerful signal acquisition, tracking and demodulation system and operation of the receiver. With this background, the receiver operation and its mode control system will be discussed in detail.

Out-of-Band Noise Power Estimate

The noise power estimate $\hat{N}$ initialized by an 8 second out-of-band noncoherent energy accumulation. Four second accumulations are done at frequencies 1536 Hz beyond each end of the uncertainty band. The initial noise power estimate is performed at frequencies outside the uncertainty band because it is certain that these frequencies will be uncontaminated by the presence of the signal. As indicated in FIG. 4, this estimate is reinitialized at 5 minute intervals until a signal has been detected. The out-of-band noise power estimate $\hat{N}$ is determined using the first order recursive formulation of Equation 3 described below.

Scan Mode

The receiver signal acquisition or scan mode utilizes a sequential-probability-ratio test (SPRT) in a novel implementation to rapidly detect the approximate location of the signal in frequency and time.

The implementation comprises the modification of the known single filter detection SPRT test to allow the simultaneous use of the multiple 4-point DFT filters which cover the I.F. filter bandwidth, to result in a multiple add-only detection filter SPRT. This improved SPRT has several significant performance improvements, including faster signal search and acquisition, a higher signal-to-noise power ratio (SNR) in each SPRT detection filter which results in less sensitivity to $C/N_o$ fluctuations and hardware induced gain changes across the frequency search band, and continuous noise power updates to minimize the impact of noise power variations with time and/or test.

Figure 5:
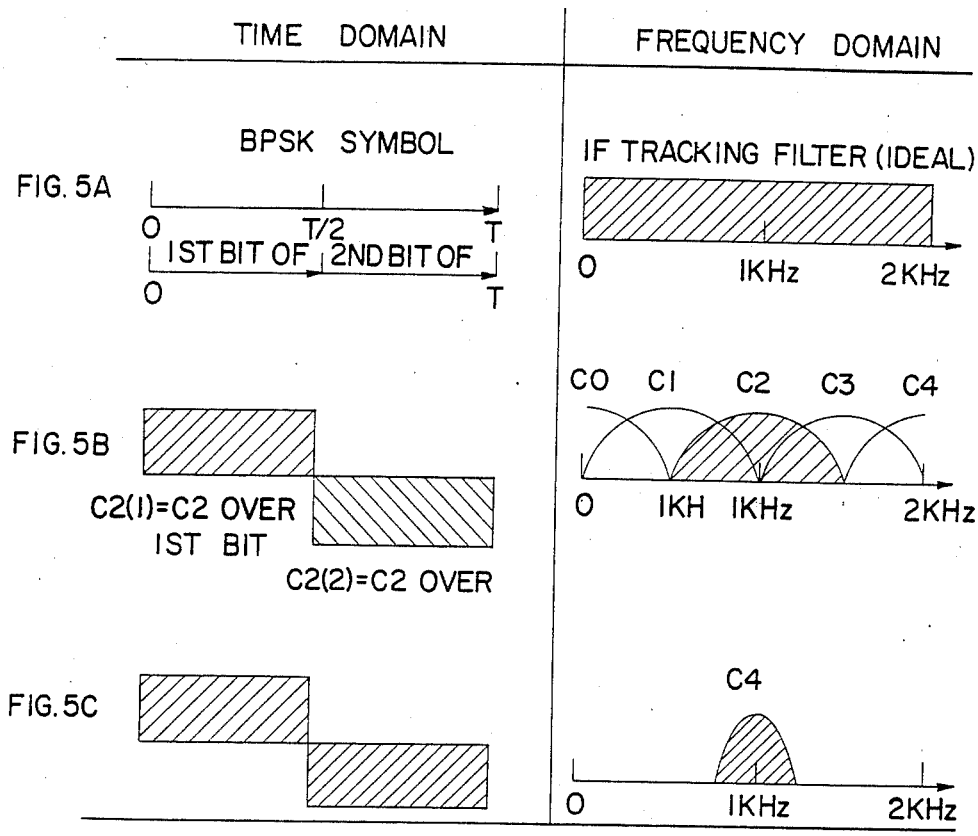
FIGS. 5a–5c are graphs illustrating the BPSK and Manchester symbols and the tracking filters in the time domain and the tracking filters in the frequency domain.

As described above, the novel SPRT of the preferred embodiment is preceeded by the determination of the out-of-band noise power estimate $\hat{N}$, made by accumulating the energy in 4-point DFT filters C1, C2, C3 illustrated in FIG. 5, using the one-step recursive equation $$\hat{N}(K) = \hat{N}(K-1) + \alpha(|C|^2 - \hat{N}(K-1)) \quad (3)$$

where $|C|$ is the magnitude of energy accululated in DFT filters C1, C2, C3 at step $K-1$, and $\alpha$ is the inverse of the number of symbols being averaged over the preceding eight seconds, i.e., $\frac{1}{2}^{12} = 1/2048$.

After each unsuccessful sweep across the frequency uncertainty band, the noise estimate is updated by the noise power in each 1536 Hz wide windows across the uncertainty band. If the signal was found during the sweep, the previous estimate is not updated. The update is calculated by energy accumulations in a recursive filter with an 8 second time constant. The noise power in each window is an unbiased power, i.e., it does not have the SPRT bias subtracted off.

In a broad sense, this SPRT consists of stepping the 2 kHz I.F. bandwidth through the frequency uncertainty band in 1536 Hz windows. At each window, six 4-point DFT SPRT tests are simultaneously performed to determine if the signal is present within the 1536 Hz window, which is the spectral width of the DFT filters C1, C2, C3 used in the test, as illustrated in FIG. 5. These six DFT SPRT filters are C1, C2, C3 at 0 and T/4 time offsets. These energy accumulations are tested against an upper threshold (signal) and a lower threshold (noise) every eight bit-times until a decision for either signal or noise is reached, or a two second timeout is reached whereupon it is decided noise is present.

If no signal is detected, the I.F. band is moved over 1536 Hz to the next window, and dwells there until it is determined that a signal is or is not present. The test continues in this manner until the entire frequency uncertainty region has been searched, the out-of-band noise power estimate is updated and the next SPRT sweep started.

The sweeping of the uncertainty band is implemented by controlling the numerically controlled oscillator (NCO) frequency so that any difference signal formed from mixing the IF signal and NCO signal, and synchronously translated to baseband would be within the frequency windows subtended by DFT filters C0, C1, C2 and C3 commencing at baseband and extending to 2 kHz.

When a signal is declared present, the frequency address, the signal level, and the time to pass the signal threshold are stored. The window with the shortest time to pass the signal threshold is declared the best estimate of the signal frequency. If two windows have the same time to pass the signal threshold, the winner is the window with the highest energy. All windows in the uncertainty band are tested before a final decision is made.

The tracking and detection filters are illustrated in FIG. 5a–5c. As shown in FIG. 5a, in the time domain, each BPSK symbol has a period T, and comprises two Manchester bits, each of period T/2. The attenuation charcteristic of the I.F. tracking filter is illustrated as an ideal filter in the frequency domain in FIG. 5a; the filter has bandwidth of 2 kHz.

FIG. 5b illustrates, in the time domain, the encoded Manchester symbol, and the attenuation characteristics of the four 4-point DFT filters C0, C1, C2, C3, which cover the 2 kHz IF filter bandwidth. The C2 tracking filter is shown centered at 1 kHz and is matched to the Manchester bits. The notation C2(1) refers to the C2 filter aligned on the first Manchester bit, and C2(2) refers to the C2 filter aligned on the second Manchester bit.

Digital filtering is well known to those skilled in the art, as are DFT digital filters. The terminology "4-point," in the context of digital DFT filters, refers to the number of complex samples per symbol which are accumulated in the DFT integrators or registers to determine the energy detected within the DFT bandwidth. Thus, for a 4-point DFT filter, four samples from the A/D converter will be integrated or added over a symbol to form the value for the signal and noise energy in the filter bandwidth.

The four DFT filters C0, C1, C2, C3 each have a 512 Hz bandwidth, centered respectively at 0, 512, 1024 and 1536 Hz. The nominal bandwidth of each ideal 4-point filter is determined by the Nyquist sampling rate. Each of the filters has 4-points or samples, each separated in time by $1/2056 = T/8$ seconds. From a Nyquist sampling rate viewpoint then, the noise bandwidth of each 4-point filter is the inverse of this symbol Manchester bit length, i.e., $2/T = 512$ Hz.

Since the center frequencies of the four filters are separated in frequency to cover four windows in the 2 kHz IF tracking filter, the matched filter processing must phase rotate the samples or points to allow the samples to be coherently added. The filters are matched to the signal, and rotating in the opposite direction and at the same rate as the signal.

The C0 filter is centered at 0 Hz and, therefore, the inphase I and quadrature Q samples may be directly summed without phase rotation. To avoid picking up any d.c. energy, however, the C0 filter integration is not used Filter C1 is centered at 512 Hz, i.e., the first harmonic, which rotates through 360° for each Manchester bit symbol with respect to the fundamental. Hence, since the four points are equally spaced in time, each point should be rotated by successive $-90°$ phase increments, i.e., $-90°$, $-180°$, $-270°$, $-360°$. A $-90°$ rotation of the complex sample $(I+jQ)$ consists of multiplying the sample by $(-j)$. Hence, the result is $(-j)(I+jQ)$ or $(+Q-jI)$. This is a very simple operation for the microprocessor; it need only interchange the values in the I and Q buffers, and invert the Q value. The second point is rotated by $-180°$, which consists of multiplying the complex sample $(I+jQ)$ by $-1$, i.e., $(-1)(I+jQ) = -(-I-jQ)$. This is also a very simple operation, simply inverting the I and Q values to be entered in the respective buffer.

The third point of the C2 filter is rotated through $-270°$, which consists of multiplying the complex sample $(I+jQ)$ by $(+j)$, i.e., $(+j)(I+jQ) = (-Q+jI)$. Again, this is a computationally simple operation. (The fourth point is rotated by $-360°$, which amounts to multiplication of the sample by $+1$, i.e., no change in the sample.

The C2 filter is aligned on the second harmonic at 1024 Hz. This filter must rotate through two complete rotations in one symbol so that each point is successively phase rotated $-180°$, $-360°$, $-540°$ (i.e., $-180°$) and $-720°$, respectively.

The C3 filter is aligned with the third harmonic at 1536 Hz and rotates through three complete cycles for each symbol. Hence, each point must be successively rotated through $-270°$ phase rotations, $-270°$, $-540°$, $-810°$ (i.e., $-90°$) and $-1080°$, respectively.

The DFT filters described above are implemented with add-only functions.

Figure 6:
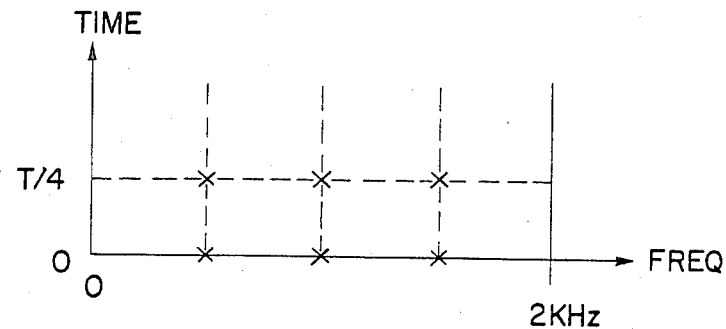
FIG. 6 is a graph illustrating the spectral and temporal locations of DFT filter energy accumulations employed in the sequential probability ratio test of the preferred embodiment

Now referring to FIG. 5c, tracking/detection filter C4 is formed by C2(1)−C(2), to comprise an 8-point DFT which is matched to the BPSK symbol. The effective attenuation characteristic of this filter is illustrated in the frequency domain in FIG. 6c, centered at 1 kHz. This 8-point DFT filter has an effective noise bandwidth of 2 kHz/8, i.e., 256 Hz.

After each sweep is completed through the 2 kHz I.F. band, the SPRT determines whether or not a signal is detected. This SPRT determination comprises four basic steps.

The first step is to accumulate the energy $\psi$ in each of six DFT filters C1, C2, C3 at 0 and T/4 offsets; the six energy accumulations are $\psi_1 - \psi_6$. This is illustrated graphically in FIG. 6, which comprises a plot of time versus frequency, with the individual filters C1, C2, C3 indicated at times 0 and T/4. The energy $\psi$ is accumulated using the equation $$\psi = \sum_k (|C|^2 - \beta \hat{N}) \quad (4)$$

where the index K indicates a summation over consecutive Manchester bits K, K+1, ..., $\beta = 1 + \alpha_o/2$.

$|C|$ = energy in DFT filters C1, C2, C3 at step K-1, $\alpha_o$ = Design point SNR for the DFT filters, approximately the lowest SNR expected to be detected.

If a signal is present having a SNR > $\alpha_o/2$, the energy value $\psi$ will increase with K and eventually exceed a positive or upper threshold value $\lambda_B \hat{N}$. If no signal is present, the $\psi$ will decrease with K and quickly fall below a negative or lower threshold value $\lambda_A \hat{N}$. The second step of the test follows from these characteristics and comprises the SPRT detection rule $$-\lambda_A \hat{N} \; \psi \lambda_B \hat{N}. \quad (5)$$

If $\psi$ is greater than $-\lambda_A \hat{N}$, but less than $\lambda_B \hat{N}$, the result is that no decision is made so the SPRT is continued. If $\psi$ is greater than $\lambda_B \hat{N}$, the decision is made that a signal is present. If $\psi$ is less than the $-\lambda_A \hat{N}$, the decision is made that only noise is present. If the test continues for more than two seconds without a decision, a default decision is made that there is no signal. A decision is required as to the energy values $\psi 1 - \psi 6$ from all six DFT filters before the dwell is terminated.

If a signal has been detected in more than one energy value $\psi 1 - \psi 6$, then the DFT filter with the shortest-time-to-pass the threshold is selected unless there is a tie whereupon the largest value is selected.

The third step of the SPRT is that the energy values $\psi$ are cotinuously used to update the noise power estimate $\hat{N}$ using the recursive equation $$\hat{N}(K) = \hat{N}(K-1) + \alpha(\psi(K-1) - \hat{N}(K-1)) \quad (6)$$

where the $\psi$ now has the bias term $\beta \hat{N}$ deleted. The correction to the noise power estimate is applied at the end of each sweep if the signal has not been found.

The fourth step to the SPRT is that the DFT locations are dithered by T/8 in time and 1/T = 256 Hz in frequency at the end of each sweep to improve the detection performance with respect to a signal that may have fallen into a "time and frequency dip" between the DFT filters. If the signal was not found, and if no new noise estimate is requested and if the elapsed time searching has not exceeded 10 minutes, another sweep is begun. The new sweep will have a dither of T/8 in timing and 256 Hz in frequency to maximize the probability of locating the signal if it was missed the previous sweep. If the signal is missed again, the next sweep will have a zero-time and zero-frequency dither (from the original non-dithered frequency and time).

Handover from SPRT to FLL/SLL

Once the decision is made that a signal has been detected, then the receiver is placed in a novel "handover" mode used to implement the mode transition from the SPRT mode to the FLL/SLL mode. SPRT signal location accuracy is ±768 Hz corresponding to the 1536 Hz search window. This wide frequency uncertainty is caused by the noise contamination of the energy statistics $\psi 1 - \psi 6$ so that a more accurate frequency decision cannot be reliably made. Also, this is the reason a reliable timing decision cannot be made. This handover mode is required to reduce the SPRT frequency $\Delta f$ and time $\Delta t$ uncertainties in the signal location to the point where acquisition by the FLL and SLL can occur. The handover mode also serves to verify that the signal has indeed been found by the SPRT before proceeding to the FLL/SLL mode. This novel handover mode comprises two steps, an estimate of the signal location, and verification that the signal is present at that location.

The novel process of locating the signal is an extension of known maximum likelihood estimation (MLE) techniques. With he known techniques, the frequency $\Delta f$ and time $\Delta t$ location of the signal detected at $\Delta f = \Delta t = 0$ by the SPRT is estimated by constructing multiple sets of signal position hypotheses throughout the $\Delta f$, $\Delta t$ region, and then selecting the best hypothesis in the maximum likelihood sense. Each hypothesis is the energy $\psi$ of a 4-point DFT accumulated over a dwell period. The optimum hypothesis using this known technique is the largest of the energy $\psi$ values. This technique is inadequate because of poor detection probability and false alarm performance. The following novel detection technique overcomes these disadvantages.

Figure 7:
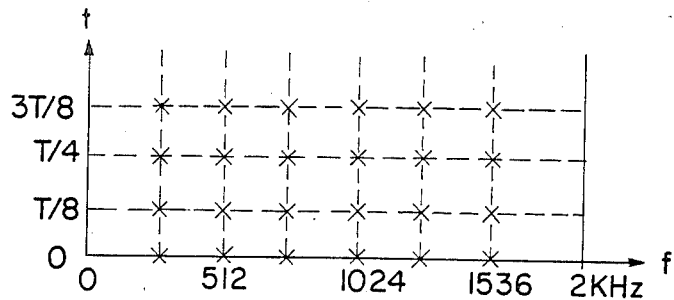
FIG. 7 is a graph illustrating the spectral and temporal locations of DFT filter energy accumulations utilized in the SPRT handover operation of the preferred embodiment.

The distribution of DFT filter energy accumulations $\psi$ is illustrated in FIG. 7. Each "X" indicates an energy accumulation for a particular time and frequency location. Twenty-four accumulations are indicated, including those centered at 768 Hz and 1280 Hz, which are obtained in the preferred embodiment by "notching" the local oscillator frequency. The signal location estimated by the SPRT is at T = 0, f = 1024 Hz.

The signal location decision rule is defined using the following notation:

$\psi(k,i)$ = Accumulated DFT energy over 512 Manchester bits (1 second) at position $\Delta f = (256 \cdot k)$Hz, $\Delta t = (i-1)T/8$ relative to the position $\Delta f = \Delta t = 0$ of the SPRT signal location estimate.

$\Delta f$, $\Delta t$ = position in the coordinate frame associated with the $\psi$ distribution in FIG. 7.

The signal location decision rule comprises the following steps:

Step 1: Reduce the search region to 3 continguous frequencies by finding the largest triplet of contiguous energy values $$\hat{k} \xleftarrow{\max_{i,k=1,2,3,4}} \left( \sum_{m=0,1,2} \psi(k+m,i) \right)$$

Step 2: Find the larges pair of contiguous energy values within the reduced Step 1 region (3×4 = 12 hypotheses)

$$\hat{\hat{k}}, \hat{i} \xleftarrow{\max_{i,k=\hat{k},\hat{k}+1}} \left( \sum_{m=0,1} \psi(k+m,i) \right)$$

Step 3: The estimated signal location time $\Delta \hat{t}$ is the position of the largest pair in Step 2.

$\Delta \hat{t} = (i-1)T/8$

Step 4: The estimated signal location frequency $\Delta \hat{f}$ is the position of the largest $\psi$ within the largest pair in Step 2.

$$\hat{k} \Longleftarrow \max_{k=\overline{k}\cdot\overline{k}+1} \{\psi(k,\hat{\imath})\}$$

$$\hat{\Delta f} = (256 \cdot \hat{k}) \text{Hz}$$

In other words, for each row of FIG. 7 each of the four contiguous triplets is examined to find the maximum sum resulting in three contiguous columns from which the signal location can be found. For each of the four rows of these three columns, there will be three terms which are candidates for the signal. Of these three terms, the pair whose sum is greatest is found. The row with the maximum pair will be the estimate of timing. The maximum single term of the maximum pair will be the selected frequency estimate of the signal.

The second aspect of the handover mode is signal verification. This verification step utilizes a Neyman-Pearson (NP) test to prevent signal false alarms from activating the FLL/SLL mode, rather than increasing the SPRT acquisition time to reduce the false alarm rate or probability $P_F$. The NP test occurs after completion of the signal location step in the SPRT handover mode.

The NP test compares the accumulated energy test statistic $\psi(\hat{k}, \hat{\imath})$ from the signal location algorithm, with a threshold equal to $\lambda\hat{N}$, where $\hat{N}$ is the noise power estimate from the SPRT. The following notation is used for the definition of the signal verification test:

---

$\hat{N}$ = Noise power estimate from out-of-band noise measurements prior to and during the SPRT
$\lambda$ = NP threshold constant of proportionality
= False alarm threshold constant
$\lambda\hat{N}$ = NP threshold
$\psi(\hat{k},\hat{\imath})$ = Accumulated DFT energy over 1 second total dwell at the estimated signal location $\hat{k},\hat{\imath}$ in FIG. 7.

---

The handover signal verification comprises the following:

$$\psi(\hat{k},\hat{\imath}) \lambda \hat{N} \qquad (7)$$

If $\psi(\hat{k},\hat{\imath})$ is greater than $\lambda\hat{N}$, then the test result indicates that a signal is present. If $\psi(\hat{k},\hat{\imath})$ is less than $\lambda\hat{N}$, then the test result is that only noise is present (no signal).

The false alarm threshold constant $\lambda$ is determined using the assumptions that the NP detection threshold equals $\lambda\hat{N}$, $\psi$ is the energy sum over a one second interval, and $\hat{N}$ the noise estimate over a two second interval. The performance parameters are $P_D$=Prob $(\psi|H1 \geq \lambda\hat{N})$, where $P_D$ is the probability of a signal passing the NP test, i.e., the probability of passing the test when a signal is present corresponding to hypothesis H1, and $P_F$=Prob $(\psi|H0 \geq \lambda\hat{N})$, where $P_F$ is the probability of a false alarm, i.e., the probability of $\psi$ passing the test when only noise is present corresponding to hypothesis H0. The threshold constant $\lambda$ is set at the $C/N_o$ design point for the desired $P_D$, $P_F$ performance. The result is that $\lambda$ has been calculated to be 1.21 for $P_D$=0.99999 and $P_F$=0.00003.

As a result of the SPRT handover, the signal location is determined to within $\pm 256$ Hz and $\pm T/16$ seconds. This signal location is provided to commence operation of the FLL/SLL.

Frequency Lock Loop (FLL)/Symbol Lock Loop (SLL)

The FLL and SLL loops include several novel features to provide rapid acquisition performance over a relatively wide frequency offset $\Delta f$ and time offset $\Delta t$ pull-in range. These features include the DFT frequency discriminant for the FLL, FLL time-dependent parameter control law relationships, the SLL discriminant, and the SLL time-dependent parameter control law.

The two FLL modes are the acquisition and track modes. In the preferred embodiment, acquisition starts at completion of the SPRT handover and lasts for six seconds. The SPRT handover frequency $\Delta f$ and timing $\Delta t$ errors respectively are tracked out by the FLL and SLL simultaneously during their acquistion phases. The track mode parameters are constant for the FLL and SLL. In addition to the (time dependent) control law change between modes, the completion of ambiguity resolution (AR) marks a change in the frequency discriminant from a Manchester bit to a full symbol as well as the replacement of the acquisition discriminant by the tracking formulation.

Figure 15:
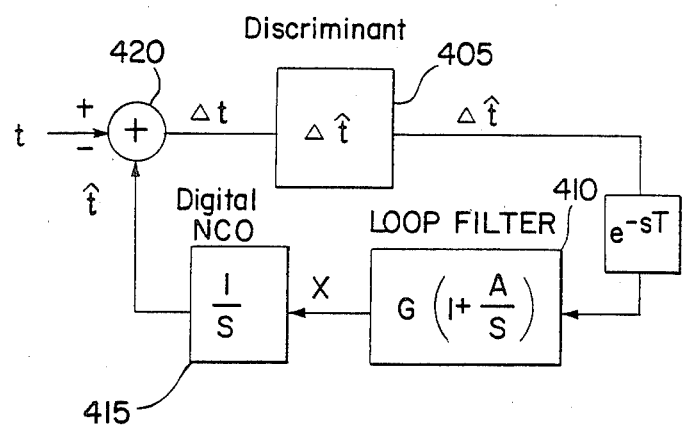
FIG. 15 is a schematic block diagram illustrating a circuit model of the symbol lock loop of the preferred embodiment.

The FLL loop is a second-order loop modelled by the equivalent circuit shown in FIG. 15. The I.F. signal f is provided to mixer 334a, where it is mixed with the signal f from NCO 365a. Mixer 335a and NCO 365a correspond respectively to mixer 334 and NCO 365 shown in the block diagram of FIG. 3. The output of the mixer 334a is a signal having frequency $\Delta f$. The discriminant $\hat{\Delta F}$ produced by estimator 363a and the loop filter 364a having the Laplace transform characteristic G/S (1+A/S) are implemented within the microprocessor of the receiver. The output of the loop filter is X, which is provided as the digital control signal to the NCO.

The operation of frequency or phase lock loops is well known in the art, and need not be descibed in detail here. The loop coefficients G and A are adaptively determined by the microprocessor, as will be described below. The following relationships are the one-step recursive equations used to calculate the FLL loop filtering for each symbol input $\Delta f$ from the FLL discriminant.

---

Loop Filtering:
G A/s²:  X1 = X1 + G · A · T · $\hat{\Delta f}$
           X2 = X2 + T · X1
G/s:       X3 = X3 + T · $\hat{\Delta f}$
NCO Input: X = X3 + X2

--- where "T" represents the symbol length. For loop initialization, the integration constants are the initial values for X1, X2, X3 which are set equal to X1=0
X2=0
X3=Handover frequency estimate where an equivalent choice is to set X3=0 and X2=handover frequency estimate.

The FLL loop is driven by the output $\hat{\Delta f}$ of the frequency discriminant whose function is to derive the estimate $\hat{\Delta f}$ of the actual frequency error $\Delta f$ seen by the FLL. In the preferred embodiment, a frequency discriminant $\hat{\Delta f}$ with the following basic characteristics is desired:

A. Acquisition and Track Prior to Ambiguity Resolution:
1. Linearity E ($\Delta\hat{f}$)=$\eta\Delta f$: Modest $\Delta f$
2. Data insensitive
3. Capability to operate with $\Delta t=\pm 3T/32$ timing offsets
4. Pull-in range to $\pm/-384$ Hz
5. Graceful degradation with low $C/N_o$
6. Discrimination over Manchester bit.

B. Track after Ambiguity Resolution:
1. Linearity E($\Delta f$)=$\eta\Delta f$: Modest $\Delta f$
2. Data insensitive
3. Tracking range to $\pm/-192$ Hz
4. Discrimination over symbol These desired characteristics assume that the $\Delta\hat{f}$ jitter does not degrade with decreasing $C/N_o$ faster than a square-law effect.

With these basic characteristics, the following relationships determine the FLL frequency discriminant $\Delta\hat{f}$.

A. Acquisition and Track Prior to AR:
$\Delta\hat{f}$ (K)=DFT discriminant over Manchester bits K=1,2

$$\Delta\hat{f}(K) = \frac{512}{\pi} \frac{C_2 {}^* \overline{C}_3{}^*(-1-j) - C_2{}^*\overline{C}_1(-1+j)}{<|C_2|>^2} \tag{8}$$

where $C_N, \overline{C}_N$=4-Point DFT tracking filter N=1,2,3 over Manchester bit K, with $\overline{C}_N$=Complex conjugate of $C_N$ $$\Delta\hat{f} = \frac{\Delta\hat{f}(1) + \Delta\hat{f}(2)}{2} \tag{9}$$

$E(\Delta\hat{f}) = \eta\Delta f$ for modest $\Delta f$ $\eta$ = Discriminant gain = 0.62 for the design point $C/N_o$ = 25 dB $-$Hz B. Track after AR:

$\Delta\hat{f} = IQ$ discriminant over symbol (10)

$$= \frac{256}{\pi} \frac{\text{Im } C_2(2)^* \overline{C}_2(1)}{<|C_2|>^2}$$

$E(\Delta\hat{f}) = \eta\Delta f$ for modest $\Delta f$.

Thus, the $\Delta\hat{f}$ prior to ambiguity resolution (AR) is the new DFT discriminant, and the $\Delta\hat{f}$ after AR is a novel modification to the known IQ discriminant, comprising the normalization of the IQ discriminant by $<|C_2|>^2$.

The signal amplitude estimate $\hat{A}32 <|C_2|>K$ is equal to the one-step recursive average of the DFT filter $C_2$ given by Equation 11.

$<|C_2|>_K = <|C_2|>_{K-1} - \alpha(|C_2|_{K-} \\ 1 - <|C_2|>_{K-1})$, (11)

where $|C_2|_{K-1}$ is the absolute value measurement of $C_2$ for the Manchester bit K$-$1.

This amplitude normalization is used throughout for the loop discriminants and lock detectors.

A second novel feature of the FLL/SLL mode is the FLL parameter control law. For the preferred embodiment, a number of parameter guidelines are observed. During signal acquisition, these guidelines include the following. The FLL loop damping coefficient $\zeta$ is selected to accomplish step response goals of achieving of a short first-zero-crossing-time, and low overshoot. For these guidelines, the allowable range in loop damping coefficient $\zeta$ values is from 0.707 to 3. With respect to $B_L$, the one-sided loop noise bandwidth, since the loop jitter is proportional to the square root of $B_L$, the loop natural frequency is proportional to $B_L$, and the first-zero-crossing-time is proportional to $1/B_L$; this results in an allowable range in $B_L$ of 0.5 to 1.5 Hz.

An additional set of acquisition guidelines, specifically referring to the functional form of the acquisition control law are the following. The frequency offset due to the loop stresses caused by changes in frequency with respect to time (df/dt) is proportional to $dG/dt/G^2A$, where G is the loop gain. To have a constant damping coefficient $\zeta$, analysis indicates the $B_L$ change with time t should be proportional to $1/\sqrt{t}$.

Tracking guidelines used to select the values for $\zeta$, $B_L$ are the following. It is desired that the damping coefficient $\zeta=0.707$. Since the loop jitter is proportional to the square root of $B_L$ and the independent-sample rate to drive the f and df/dt estimator is approximately equal to 2 $B_L$. This restricts the allowable $B_L$ range from 0.1 to 1.0 Hz.

With these guidelines, the control law relationships of Equations 12, 13 and 14 determine the FLL operation.

For $X = B_L, \zeta$ (12)

$X = X_0 + (X_1 - X_0)(t/t_1)(2 - t/t_1)$ for $t \leq t_1$ $= X_0$ for $t = 0$ $= X_1$ for $t > t_1$ $dX/dt = 0$ for $t = t_1$ $$G = \frac{1}{\eta} \frac{4B_L}{1 + \frac{1}{4}\zeta^2} \tag{13}$$

$$A = \frac{B_L}{\zeta^2 + \frac{1}{4}} \tag{14}$$

Both the bandwidth $B_L$ and damping factor $\zeta$ follow the generalized equation 12 for X. Based upon the foregoing relationships, the initial loop parameters for $X=X_o$ are $B_L=1.12$ Hz, $\zeta=2.0$, $\eta=0.62$ (constant), $G=6.801$ and $A=0.264$. The final loop parameters, for $X=X_1$, are $B_L=0.28$ Hz for $t_1=6$ seconds, $\zeta=0.707$ for $t_1=2$ seconds, $G=1.204$ and $A=0.373$.

A novel feature of this loop control law is that during FLL mode operation, both the noise bandwidth and damping coefficient which specify the loop parameters G, A may be simultaneously time controlled by the microprocessor. This provides greatly increased adaptive FLL performance.

During FLL operation, the symbol lock loop (SLL) is driven by the estimate $\Delta\hat{t}$ of the SLL timing error $\Delta t$ provided by the SLL loop discriminator.

Figure 16:
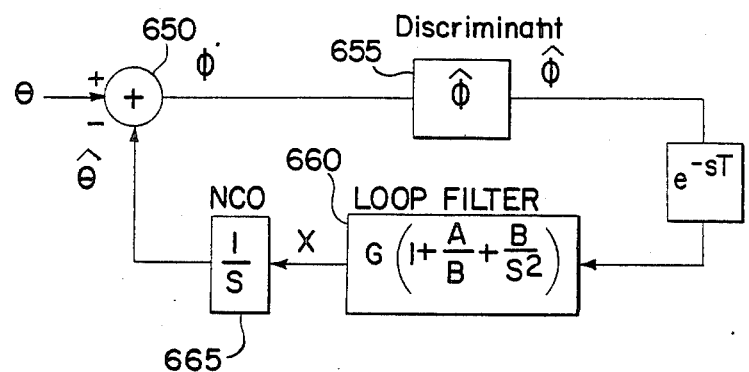
FIG. 16 is a schematic block diagram illustrating a circuit model of the phase lock loop of the preferred embodiment.

The second order symbol lock loop is modelled by the circuit shown in FIG. 16. The bit or symbol transition time t of the received BPSK waveform is provided to "mixer" 420, where it is "mixed" with a time estimate $\hat{t}$, which is the SLL estimate of t. $\hat{t}$ controls a pointer that determines the start time for the tracking/detection 8-point filter C4 summation, as well as the start time for the other 4-point DFT filter summations. The timing offset $\Delta t=(t-\hat{t})$ is provided to estimator 405 where the timing discriminant $\Delta\hat{t}$ is determined. The discriminant is filtered by a loop filter having the Laplace transform characteristics $G(1+A/s)$. The output of filter 410 is digital signal X, which controls digital NCO 415, which has the Laplace transform characteristic $1/s$. The digital NCO output is $\hat{t}$. This SLL is implemented entirely within the receiver digital processor.

The following relationships comprise the one-step recursive equations used to calculate the loop filtering plus the digital NCO output for each symbol, from the SLL discriminant output $\Delta\hat{t}$.

Loop filtering GA/s: $X1=X1+G\cdot A\cdot T\cdot\Delta\hat{t}$
Digital NCO input: $X=G\cdot\Delta\hat{t}+X1$
Digital NCO output G/s: $\hat{t}=\hat{t}+G\cdot T\cdot X$ For loop initialization, the integration constants are the initial values for X1 set equal to X1=0, $\hat{t}$=handover timing estimate. The loop coefficients or parameters G, A are calculated for each symbol, as described below. During FLL operation, phase coherency between contiguous symbols is not required for any of the functions, so the SLL loop is closed with the timing quantization or granularity equal to T/32, the A/D digitization interval. During PLL operation, this will be changed, as described below.

As previously described, the SLL is internal to the microprocessor. For the preferred embodiment, the timing discriminant $\Delta\hat{t}$ has the following basic characteristics:

Acquisition and Track prior to AR:
1. Linearity E $(\Delta\hat{t})=\eta\Delta t$, for modest $\Delta t$ values
2. Operable with all data transition densities
3. Operable with $\Delta f=+/-256$ Hz frequency offsets
4. Pull-in range over all $\Delta t$
5. Stable lock points at mid-bit and bit transitioning
6. Graceful degradation at low $C/N_o$
7. Discrimination over Manchester bit Acquisition and Track after AR:
1. Linearity $E(\Delta\hat{t})=\eta\Delta t$ : Modest $\Delta t$
2. Data insensitive
3. Operable with $\Delta f=+/-192$ Hz frequency offsets
4. Tracking range over all $\Delta t$
5. Stable lock point at mid-bit transitioning
6. Graceful degradation at low $C/N_o$
7. Discrimination over symbol These characteristics assume that the $\Delta\hat{t}$ does not degrade with $C/N_o$ at a rate faster than the square-law effect.

Figure 8:
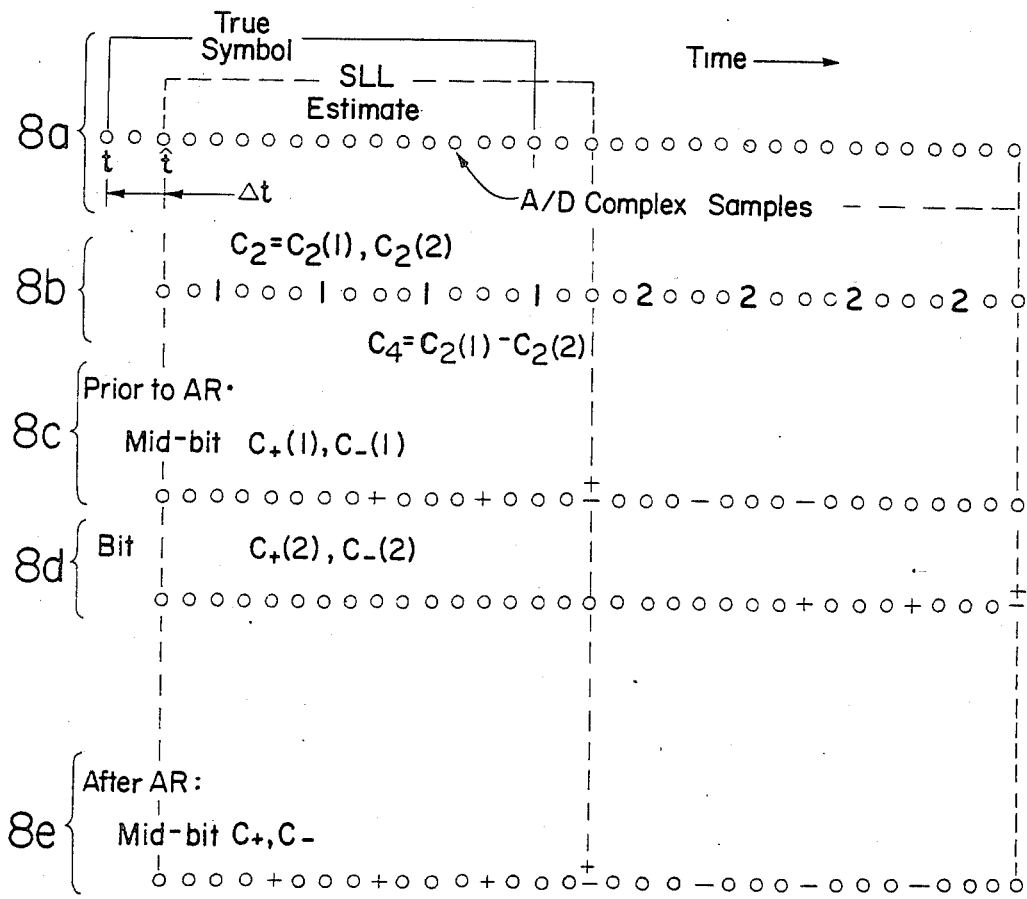
FIG. 8a–8e are time chart illustrations of the relationship of true and estimated symbol timing to A/D complex samples and DFT filter operation.

The symbol timing loop operation is graphically illustrated in FIGS. 8a-8e. FIG. 8a illustrates the true symbol location, which starts at time t and the SLL estimate of the symbol location, starting at $\hat{t}$. The symbols depicted are Manchester bit symbols. $\Delta t$ comprises the difference between t and $\hat{t}$, $\Delta t=t-\hat{t}$. The A/D converter complex samples are illustrated as points along the time axis in FIGS. 8a-8e.

The samples for tracking filter C2 are depicted in FIG. 8b. Filter C2 comprises C2(1), a 4-point DFT filter matched to the first bit of the Manchester symbol, and C2(2), a 4-point DFT filter matched to the second bit of the Manchester symbol. In FIG. 8b, the samples for C2(1) are depicted as "1" occurring every fourth A/D sample in the first symbol, and the samples for C2(2) are illustrated a "2" occurring every fourth sample in the second Manchester bit. As described above, in the preferred embodiment the A/D converter is driven at 4 times the Nyquist symbol rate. However, only every fourth sample is utilized to form the DFT filters.

As described above, tracking/detection filter C4 is an 8-point un-normalized DFT filter formed by subtracting C2(2) from C2(1), $C4=C2(1)-C2(2)$.

The SLL discriminant has the form of a "bang-bang" function, and is calculated from the output of matched filters with differing time-alignment. Prior to ambiguity being resolved, the matched filters are formed from 3 complex data points, and are calculated across a nominal bit timing and across the mid-bit transition, a T/2 offset. After ambiguity is resolved, 4 complex points are used to form the filters, and the matched filters are calculated only across the mid-symbol transition. The SLL discriminant is normalized by the estimate of the magnitude of signal-plus-noise energy in DFT filter C2, $<|C_2|>$.

The 3-point un-normalized DFT filters formed to calculate the SLL discriminant $\Delta\hat{t}$ prior to AR are depicted in FIGS. 8c and 8d. The DFT filters calculated across the mid-bit transition are depicted in FIG. 8c as $C_+(1)$, $C_-(1)$, with the three A/D samples for $C_+(1)$ depicted as "+," and the three samples for $C_-(1)$ depicted as "—." The DFT filters calculated across the bit transition are depicted in FIG. 8d as $C_+(2)$ and $C_-(2)$, with the three A/D samples for $C_+(2)$ depicted as "+," and the A/D sample for $C_-(2)$ depicted as "—" (the other two samples for $C_-(2)$ are in the next bit, not shown in FIG. 8d).

The 3-point DFT filters are used prior to AR instead of 4-point filters. Although the 3-point filters have more noise due to their wider noise bandwidth (682 Hz), they are less susceptible to errors caused by excessive timing jitter than the 4-point filters. The 3-point filters are centered at the same frequency 1024 Hz as the 4-point filter $C_2$, and the same phase rotation, 720°, is applied.

The SLL discriminant $\Delta\hat{t}$ used in SLL operation prior to ambiguity resolution is calculated in accordance with Equation 16.

$$\Delta\hat{t} = (\frac{1}{2}) \sum_{K=1}^{2} \frac{|C_+(K)| - |C_-(K)|}{<|C_2|>} \quad (16)$$

After ambiguity resolution occurs, the SLL discriminant is calculated from the output of a 4-point DFT across the mid-bit, i.e., Manchester transition. The 4-point DFT is used because it provides a higher signal-to-noise ratio (SNR). The two 4-point unnormalized DFT filters are depicted in FIG. 8e as $C_+$, $C_-$, with the A/D samples depicted as "+" and "—," respectively. The SLL discriminant after $\Delta t$ used after ambiguity resolution is calculated in accordance with Equation 17.

$$\Delta t = \frac{|C_+| - |C_-|}{<|C_2|>} \quad (17)$$

A discriminant gain or scale factor $\eta$ is used to ensure a 1:1 relationship between the SLL input and output. For modest $\Delta t$ values, $E(\Delta\hat{t})=\eta\Delta t$, resulting in a selected value for $\eta=0.4$, for the design point $C/N_o=25$ db-Hz and 62.5% data transitioning. Other design points and applications would, of course, result in different scale factor values.

The SLL damping factor $\zeta$ and bandwidth $B_L$ parameters are developed using the following guidelines. For the preferred embodiment, it was desired that the damping factor $\zeta$ be between 0.707 and 2.0. The loop jitter $\sigma\Delta t$ is proportional to $\sqrt{B_L}$, the loop first-zero-crossing time is proportional to $1/B_L$, and the loop offset due to timing drift is proportional to $1/B_L^2$. It was desired that the loop jitter be less than or equal to T/32, and that the first-zero-crossing time be less than or equal to six seconds for acquisition and twenty seconds for tracking. The offset due to timing drift was desired to be much less than T/32.

With these guidelines, novel control law relationships were developed to allow the simultaneous time control of both $B_L$ and $\zeta$. In the preferred embodiment, the damping coefficient $\zeta$ is 1.0. The bandwidth $B_L$ follows the relationship of Equations 18.1 and 18.2.

$$B_L = 0.5 - (0.5 - 0.15)(t/15) \text{ Hz, for } t \leq 15 \text{ seconds} \qquad (18.1)$$

$$B_L = 0.15 \text{ Hz, for } t > 15 \text{ seconds} \qquad (18.2)$$

The SLL parameters G and A are calculated from $B_L$ and using the relationships described in Equations 19 and 20:

$$G = \frac{1}{\eta} \frac{4 B_L}{1 + \frac{1}{4}\zeta^2} \qquad (19)$$

$$A = \frac{B_L}{\zeta^2 + \frac{1}{4}} \qquad (20)$$

For the values $\eta = 0.4$ and $\zeta = 1$, $G = 8 B_L$ and $A = 0.8 B_L$. Thus, by adaptive control of $B_L$ by the microprocessor, simultaneous time control of the SLL loop parameters G and A can be achieved.

The discriminant $\Delta \hat{f}$, then, is smoothed with a second order filter. The filter bandwidth $B_L$ decays linearly for the first 15 seconds during the FLL mode. The two loop parameters (G and A) are updated once per second such that the bandwidth $B_L$ decays from 0.5 Hz to 0.15 Hz, while the filter damping factor remains at a constant value of 1.0 at all times. (When the SLL is operating during PLL, the bandwidth and damping have the constant values of (0.15 Hz) and (1.0), respectively.)

The SLL filter output is used to provide a new readout pointer controlling the buffer. The result of the ambiguity resolver processing is an output which causes the pointer to remain the same (if the assumed timing was found to be the symbol transition) or to be increased by T/2 (if the assumed timing was found to be the mid-symbol transition). This AR correction is calculated only once during the FLL mode, and is not recalculated until the FLL mode is restarted.

Least-Square-Estimation

The use of an NCO-input-driven, least-squares-estimate (LSE) of the frequency f and frequency rate df/dt being tracked by the FLL represents a novel technique which significantly enhances the FLL performance. LSE estimates $\hat{f}$, d$\hat{f}$/dt of the f, df/dt are derived from the FLL loop filter input to the NCO over the last 18 seconds of the FLL mode, and are handed off to the PLL as the set of initial conditions on f, df/dt.

The PLL requires accurate estimates to $\hat{f}$, d$\hat{f}$/dt to reliably acquire the signal. A separate estimator driven by the FLL is used to provide these estimates, since the FLL and PLL are contiguous and non-overlapping modes. Based upon considerations of performance, risk, and microprocessor loading, the LSE was used to implement the estimator.

Figure 9:
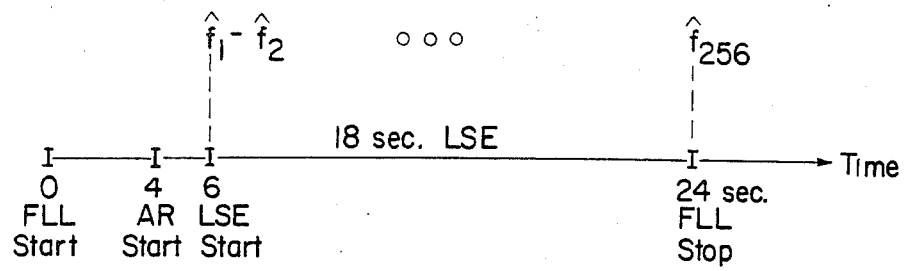
FIG. 9 is a time chart illustrating the timing of operations in the frequency lock loop mode of the preferred embodiment.
Figure 17:
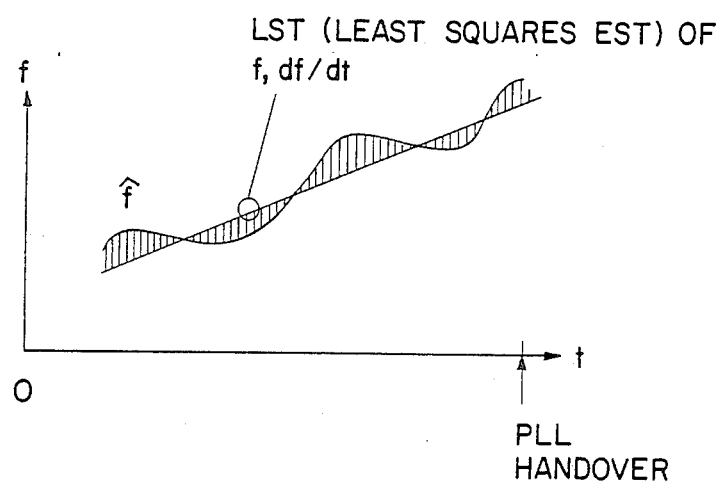
FIG. 17 is a graph illustrating the Least Squares Estimation of the frequency and frequency rate which is provided to the PLL on initialization.

As illustrated in FIG. 17, the LSE straight-line curve fit to the NCO input data generates the estimates $\hat{f}$, d$\hat{f}$/dt at the end of the estimation interval. This process is illustrated in the timeline of FIG. 9. This timeline commences at time 0, when the FLL is started. At time t=4 seconds, ambiguity resolution (AR) commences. At time t=6 seconds, the LSE estimator commences operation and accumulates NCO input f estimates $\hat{f}_1$, $\hat{f}_2$ ... $\hat{f}_{256}$ at 18 symbol intervals until t=24 seconds, at which time FLL operation ceases.

The NCO input data $\hat{f}_1$, $\hat{f}_2$ ... $\hat{f}_{256}$ is accumulated to form values F and G in accordance with Equations 21 and 22:

$$F = \sum_{i=1}^{N} (\hat{f}_i - \hat{f}_1) \qquad (21)$$

$$G = \sum_{i=1}^{N} (i - 1)(\hat{f}_i - \hat{f}_1) \qquad (22)$$

LSE coefficients are formed as shown in Table II, which shows both the theoretical coefficient relationships and the relationships acutally used in the microprocessor.

TABLE II

| Coefficient | Theory | Processor |
| --- | --- | --- |
| $C_1$ | $2(N - 2)/N(N + 1)$ | $-2/N$ |
| $C_2$ | $6/N(N + 1)$ | $6/N^2$ |
| $C_3$ | $-6/N(n + 1)T_s$ | $-6/N^2 T_s$ |
| $C_4$ | $12/N(N^2 - 1)T_s$ | $12/N^3 T_s$ | where N = 256 NCO samples
$T_s$ = 18/256 seconds = Time between NCO samples.

Using the coefficients shown in Table II, a novel set of relationships, described in Equations 23 and 24, is developed for calculating the $\hat{f}$ and d$\hat{f}$/dt estimates:

$$\hat{f} = \hat{f}_1 + C_1 F = C_2 G \qquad (14)$$

$$d\hat{f}/dt = C_3 F + C_4 G \qquad (15)$$

These algorithm represent a novel, powerful LSE method for determining the $\hat{f}$, d$\hat{f}$/dt values.

PLL Operation

Once FLL operation has been completed, the receiver mode control system shifts receiver operation to the PLL mode.

The PLL may be modelled by the circuit shown in FIG. 17. The phase $\theta$ of the signal is provided to phase detector 650 output is a value $\phi$. The phase discriminant $\hat{\phi}$ determined by estimator 655 from $\phi$ and is filtered by loop filter 660, which has a Laplace transform characteristic $G(1 + A/s + B/s^2)$. The output of filter 660 is "X", which controls NCO 665, with transform characteristic 665. The NCO output $\hat{\theta}$ is provided to phase detector 650.

The one step recursive equations used to calculate the loop filtering for each symbol input $\hat{\phi}$ the PLL discriminant are discribed by the following relationships.

| Loop filtering: $GB/s^2$ | X1 = X1 + G · B · T · $\hat{\phi}$ |
| --- | --- |
|  | X2 = X2 + T · X1 |
| GA/s: | X3 = X3 + G · A · T · $\hat{\phi}$ |
|  | X = G · $\hat{\phi}$ + X3 + X2 |

For loop initialization, the integration constants are the initial values for X1, X2, X3. These values are selected to cause the NCO to follow the LSE estimated $\hat{f}$ and d$\hat{f}$/dt at PLL startup until the PLL has time to modify their estimates. This specifies the integration constants to be X1=df̂/dt
X2=0
X3=f̂ at PLL start There is a choice in either setting X2=0, X3=f̂ or equivalently setting X2=f̂, X3=0. The loop coefficients or parameters G, A, B are calculated for each symbol as described below.

This PLL mode implements several novel features which substantially enhance the acquisition performance of the PLL mode. These novel features include the control of the PLL performance parameters $B_L$, $\zeta_1$, $\zeta_2$ by a lock detector statistic $\psi_2$, and the use of an amplitude estimate Â to normalize the phase discriminant which drives the loop.

The PLL function is updated at the symbol rate of 256 times per second. The PLL uses only the DFT filter centered around the signal, $C_2$, in its processing. The DFT filter is formed over the full symbol time. The PLL discriminant is input to the PLL loop filter which provides the feedback to track the signal coherently in phase.

The PLL is a third-order loop necessary to track the quadratic change in phase due to the strong Doppler rate present on the carrier frequency. The loop performance parameters $B_L$, $\zeta_1$, $\zeta_2$ are a function of both time and the value of the PLL lock statistic $\psi_2$. $\zeta_1$ and $\zeta_2$ respectively correspond to the third-order real pole and the second-order complex pole pair of the closed loop transfer function.

During acquisition, an adaptive bandwidth control, based upon the lock statistic, narrows down the bandwidth as the PLL locks on the signal, to a final value given by the system bandwidth curve. Once phase lock is achieved, the bandwidth control passes over entirely to the system bandwidth decay curve, which decays linearly from 12 to 8 Hz over the 160 seconds following the start of the PLL module. The damping coefficients $\zeta_1$, $\zeta_2$, of the loop are fixed at 1.5 and 0.5.

A novel feature of the PLL mode is that the loop parameters $B_L$, $\zeta_1$, $\zeta_2$ are independently controlled by the lock detector statistic $\psi_2$, in contrast to conventional PLL systems which only allow $\psi_2$ to control one of the three independent design parameters G, A, B. This novel feature results in a significant improvement in acquisition performance.

This feature may be better understood by considering known analog PLL loop applications of the lock detector statistic $\psi_2$. The loop gain G for analog Costas loops is the product of a hardware gain K and the signal amplitude A, so that G=K*A. As the C/N$_o$ (carrier power to noise density ratio) drops, the loop gain G drops through the decrease in A since C=A²/2. This causes the (one-sided) loop noise bandwidth $B_L$ to decrease and thereby partially alleviate the increase in loop jitter with C/N$_o$ decrease. In addition, the K can be further reduced by controlling it with $\psi_2$.

Another application of $\psi_2$ control has been initial acquisition where, under low C/N$_o$ conditions, it is desirable to open up $B_L$ to allow "cycle slipping" to occur. As lockup takes place, the cycle slipping will gradually stop whereupon the $B_L$ should be at a somewhat smaller value. Controlling this $B_L$ decrease through variations in K as a function of $\psi_2$ has proven to be effective.

From a control theoretic viewpoint, a complete state controller statistic or cost function should be an independent function of the PLL offset or mean and the 1-sigma jitter. While $\psi_2$ is a composite function of the mean and 1-sigma jitter, and therefore not a complete statistic, it is, nevertheless used as the acquisition controller in the preferred embodiment.

The PLL acquisition parameters G, A, B are controlled by using the PLL control law relationships in Equation 25.

Control Law          (25)

$$X = X_0 + (0.4\ X_1 - 1.6\ X_0)\psi_2 + 0.6\ (X_1 + X_0)(\psi_2)^2$$

$$= X_0 \text{ for } \psi_2 = 0$$

$$= X_1 \text{ for } \psi_2 = 1, \text{ where } \psi_2 = 0, 1$$
respectively correspond to the non-attainable, ideal lock, unlock states.

This functional form for the control law applies to the respective PLL acquisition parameters G, A, B upon replacing the dummy parameter X by G, A, B in turn.

The quadratic (second-order) relationship of X on the lock statistic was used instead of a linear (first-order) or a step function of $\psi_2$ to improve the phaselock acquisition performance.

The initial PLL parameters are the following:

| Performance: | $B_L$ = 38.8 Hz |
| --- | --- |
|  | $\zeta_1$ = 0.002 |
|  | $\zeta_2$ = 2.75 |
| Processor: | $G_0$ = 150.0 |
|  | $A_0$ = 5.02 |
|  | $B_0$ = 0.24 |

The final PLL parameters are the following:

| Performance: | $B_L$ = 5 Hz |
| --- | --- |
|  | $\zeta_1$ = 1.5 |
|  | $\zeta_2$ = 0.5 |
| Processor: | $G_1$ = 14.545 |
|  | $A_1$ = 4.848 |
|  | $B_1$ = 7.836 |

The initial values for G, A, B were obtained by selecting appropriate performance parameters for the frequency lock loop (FLL) or cycle slip mode of the The final values for G, A, G listed were determined by selecting the appropriate $B_L$, $\zeta_1$, $\zeta_2$, which are the final values listed.

Figure 10:
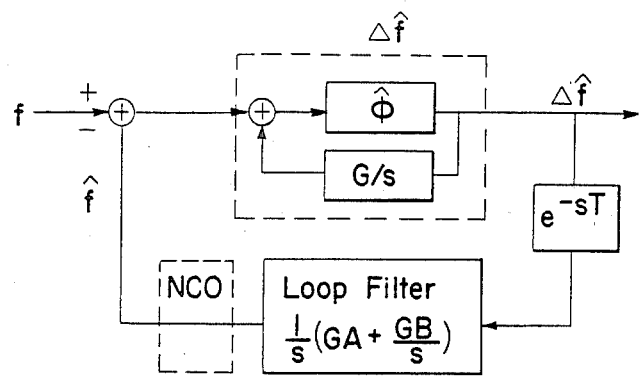
FIG. 10 is a circuit model of the phase lock loop operating in the cycle-slip mode of the preferred embodiment.

The selection of the initial values for G, A B follows from consideration of the FLL or cycle slip operation carried out within the PLL mode. This FLL type operation is required to track out the extremes of the frequency and frequency rate errors from the FLL handover, which can occur at low C/N$_o$. It is well known that FLL type operation of a PLL requires a PLL cycle slip and/or an FLL aided PLL. A PLL cycle slip operation has been implemented in the preferred embodiment. In the cycle slip mode, the PLL of the preferred embodiment behaves like a second-order FLL modelled as shown in FIG. 10, where T represents the symbol loop delay. In the phase track mode, the PLL behaves like the phase lock loop modelled as shown in FIG. 16.

The acquisition mode consists of a transition from the PLL cycle slip mode to the PLL phase track mode. During this transition, the PLL lock detector statistic $\psi_2$ (defined below) will increase in value as phase lock occurs and will simultaneously control the parameter G, A, B transitioning from the cycle slip values to the phase track values.

FIGS. 16 and 10 describe the PLL loop model in the phase track (phase lock), cycle slip modes respectively. In FIG. 10, the loop design parameters comprise $B_L$, $\zeta$ and B/A. In this mode, the PLL develops a frequency estimate $\Delta \hat{f}$. As the signal is acquired, i.e., as phase lock occurs, the PLL operation transitions to the phase track mode. In this mode, illustrated in FIG. 16, the PLL loop design parameters comprise $B_L$, $\zeta_1$, $\zeta_2$.

Normalization of the PLL lock statistic $\psi_2$ and phase discriminant $\hat{\phi}$ the amplitude estimate $\hat{A}$ is an important factor in providing high predictable PLL performance. The PLL lock statistic $\psi_2$ in normalized form is defined by Equation 25:

$$\psi_2 = \eta_1 \frac{<(I^2 - Q^2)>}{<|C_2|>^2} \quad (25)$$

where $(I^2 - Q^2) = (Re\ C_4)^2 - (Im\ C_4)^2$ $C_4$ = 8-Point *DFT* tracking/detection filter $\quad = C_2(1) - C_2(2)$ $C_2(K)$ = 4-Point *DFT* tracking filter over $K = 1,2$ = first, second half-bits or Manchester bits $\lambda_{PLL} = 0.5$, lock detector threshold $<|C_2|> = \hat{A}$ The PLL phase discriminant $\hat{\phi}$ in normalized form is defined by Equation 26.

$$\hat{\phi} = \eta_2 \frac{(\text{sign } I)\ Q}{<|C_2|>} \quad (26)$$

where I, Q are as defined with respect to Equation 25 and the $\eta_1$, $\eta_2$ are PLL loop scaling constants.

For PLL operation, the SLL feedback estimate $\hat{t}$ is quantized to T/16 increments. The SLL operation is changed at PLL startup to minimize the interaction between these two loops. During FLL operation, phase coherency between contiguous symbols is not required for any of the functions so the SLL loop was closed with the timing quantization or granularity equal to T/32 which is the A/D digitization interval. During PLL, the SLL timing estimate $\hat{t}$ determines the start time for the tracking/detection filter $C_4$ DFT summation. Changes in $\hat{t}$ between contiguous symbols cause phase shifts in $C_4$ which must be compensated to avoid SLL phase noise injection into the PLL. To keep this phase compensation in 90° increments so they can be implemented with add-only algebraic operations, the SLL t is restricted to T/16 jumps. Software realization of the $\hat{t}$ is a pointer that specifies the $C_4$ start time in the A/D output buffer memory. Thus, $N_{SLL}$ is the SLL timing estimate $\hat{t}$ address or pointer for the DFT samples from the A/D memory. The PLL pointer $N_{PLL}(K)$ is determined by the following relationship:

$$N_{PLL}(K) = N_{PLL}(K-1) + 2\lfloor N_{PLL}(K-1) - N_{SLL}(K-1))/2\rfloor$$

where the indices K, K−1 refer to symbols K, K−1 respectively, the address pointers are integers whose values are scaled to the A/D timing interval T/32, and the symbol $\lfloor (o) \rfloor$ is the rounded down integer value of (o).

The PLL angle correction is −Q, I for a pointer change between symbols K−1 and K equal to $N_{PLL}(K) - N_{PLL}(K-1) = -T/16$, and +Q, −I for +T/16, where the pointer $N_{PLL}$ is controlled by the SLL timing estimate and specifies the start time for the DFT filter summation.

Lock Detection

Another novel feature of the receiver comprises the implementation of a lock detector system to cover the complete 2 kHz I.F. bandwidth seen by the loops.

Insofar as is known to applicant, there is no prior art for determining a lock detector to cover the complete $\Delta f$, $\Delta t$ range over a wide variation in $C/N_o$ conditions.

The primary disadvantage in using Manchester encoded BPSK modulation to achieve maximum $E_b/N_o$ performance is the danger of "cycle slip," and the concurrent danger the receiver could track at a false lock point, i.e., any frequency $\Delta f$ and time offset $\Delta t$ different from zero at which the PLL will continue to operate. Cycle slip occurs when the combination of PLL loop stress and noise statistics cause the receiver to track at 180° from its nominal reference, thereby causing a sign inversion of all subsequent demodulated data. Cycle slip may also result in a bit slip or loss of a bit. In either case, the real danger of cycle slips is the possibility for the receiver to jump to a false lock point. In addition, during the acquisition process, a possibility exists for tracking a false lock point in handover to the PLL, which then continues to track at this false lock point.

The lock detector system of the preferred embodiment solves the false lock problem, and requires simultaneous confirmation of lock by the following six tests:

TEST 1:
$\psi_2 \geq 0.5$ (This is to test for PLL phase lock near $\Delta f = 0$ and $\Delta t = 0$, where the PLL lock statistic $\psi_2$ is defined above in Equation 25.)

Figure 11:
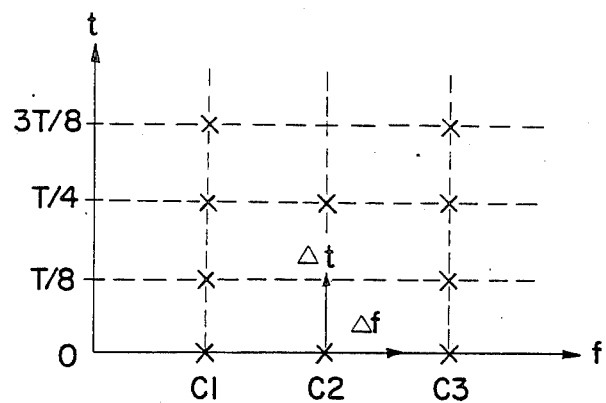
FIG. 11 is a graph illustrating the spectral and temporal location of DFT filter accumulations of the preferred embodiment.

Tests 2–6 require reference to the graph of FIG. 11, which shows the locations of ten 4-point DFT filter energy accumulations in relation to time t and the 2 kHz IF frequency bandwidth. The following notations are utilized in tests 2–6:

$\psi C1$ = Energy accumulation of filter C1 at $\Delta t = 0$
$\psi C2$ = Energy accumulation of filter C2 at $\Delta t = 0$
$\psi C3$ = Energy accumulation of filter C3 at $\Delta t = 0$
Max $\psi$ = Maximum of the $\psi$'s excluding $\psi_{C2}$
Min $\psi$ = Minimum of the $\psi$'s excluding $\psi_{C2}$
Max $\psi_{1,3}$ = Maximum of $\psi_{C1}$, $\psi_{C3}$ TEST 2:
$\psi_{C2}/\text{Min } \psi > 1.1$ (This is a test to determine if $C/N_o > 21$ db-Hz.)

TEST 3:
$\psi_{C2}/\text{Max } \psi_{1,3} > 1.1$

TEST 4: $\psi_{C2}/\text{Max } \psi > 1.0$ (Tests 3 and 4 are checks for large $\Delta f$, $\Delta t$ offsets, with the threshold 1.1 set for $C/N_o = 21$ db-Hz.)

TEST 5:
Min $\psi$/Max $\psi_{1,3} > 0.9$. (This test is a check to be sure that DFT filters $C_1$ and $C_3$ at $\Delta t = 0$ only contain noise.)

TEST 6: $\psi_{AR} > 188 <|C_2|>$ (This is an ambiguity resolver (AR) test which checks for $\Delta t$, $\Delta f$ near T/2, 0, with the AR test statistic $\psi_{AR}$ defined as described below.)

During the PLL mode, the AR accumulates measurements of the "mid-bit" versus "bit" transitioning and compares the sum with "+" threshold to decide whether the SLL is correctly aligned or one-half bit off (which means it is tracking the mid-bit transitions) using the algorithm of Equation 27

$$\psi_{AR} = C1(K) - C2(K) \quad (27)$$

where
K is a value corresponding to an eight second accumulation.

The phase lock test (Test 1) is repeated every ¼ second once phase lock has occured. The remaining tests 2–6 are repeated every eight seconds after PLL startup, since these tests require about eight seconds to average out the noise variation of the coefficients used in the tests and it will be an abnormal occurrence for the the FLL, SLL and AR detectors to go out of lock once the signal has been acquired. Loss of phase lock has a much higher probability of occurrence, accounting for its more frequent lock checks.

Ambiguity Resolution during FLL/SLL

The ambiguity resolver (AR) works by establishing the true symbol edge of the Manchester encoded data versus the mid-symbol transition. Once established, two chances are then given for decision verification during the FLL oepration.

With Manchester encoding, the symbol will always have a phase transition at the mid-symbol point and may or may not have a phase transition at the symbol edge depending upon the data stream. A counter is used as an integrator to determine the correct resolution. This integrator (or ambiguity statistic) counts up when a phase transition occurs at the assumed mid-symbol point and counts down when a phase transition occurs at the assumed symbol edge. This statistic is left to integrate continuously for a maximum period of six seconds or until it exceeds either the positive or negative AR threshold. The statistic is checked against the thresholds once per second by the mode control system.

If the positive threshold is exceeded, more phase transitions were detected at the assumed mid-symbol position than at the symbol edge so that the assumed Manchester symbol phasing was correct. In this case, the timing reference is left unchanged. If the negative threshold is exceeded, the opposite is true in that more phase transitions were detected at the assumed symbol edge than at the mid-symbol point. This implies that the assumed Manchester symbol phasing was a half symbol off, so the read-out pointer is moved by T/2 to align the symbol timing.

After AR lock is indicated, the AR is given two chances (six seconds maximum for each chance) to verify the original decision. If resolution is not established after the first six seconds or not verified consequentially, the receiver is returned to the scan mode or SPRT operation.

After four seconds into the FLL mode, the transients due to the initial offsets $\Delta f$, $\Delta t$ will have settled down sufficiently to allow the AR to be turned on. Within roughly two seconds, the AR will have decided whether the SLL is tracking the mid-bit or bit transition points of the symbol. After the AR makes its decision, the discriminant changes are: (1) the FLL discriminant is switched from two half symbol DFT's to a full symbol IQ discriminant, and (2) the single mid-bit 4-point DFT is substituted for the two 3-point DFTs straddling the mid-bit and bit transition points. Within two additional six second trial periods, a confirming AR decision is required to reduce the false alarm of false decision probability.

The AR accumulates measurements of the mid-bit versus bit transitioning and compares the sum with $+/-$ thresholds to decide whether the SLL is correctly aligned or one-half bit off (which means it is tracking the mid-bit transitions). The following notations are utilized for the AR test:

| Threshold Testing | |
|---|---|
| $I_K(C_{uv}(M)) =$ | 1 for $C_{uv}(M) \geq \lambda$ |
| $=$ | 0 for $C_{uv}(M) < \lambda$ |
| where: $I_K(C_{uv}(M)) =$ | Indicator decisioning function of the detection filter $C_{uv}(M)$ for symbol K. |
| $C_{uv}(M) =$ | Transition detection filter for M = 1,2 and uv = up, dn. |
| Transition Counters C1, C2: | |
| For M = | 1,2 |
| $CM(K+1) =$ | $CM(K) + I_K(C_{up}(M)) - I_K(c_{dn}(M))$ |
| $=$ | Transition counter C1, C2 for M = 1,2 at symbol K. |

Figure 14:
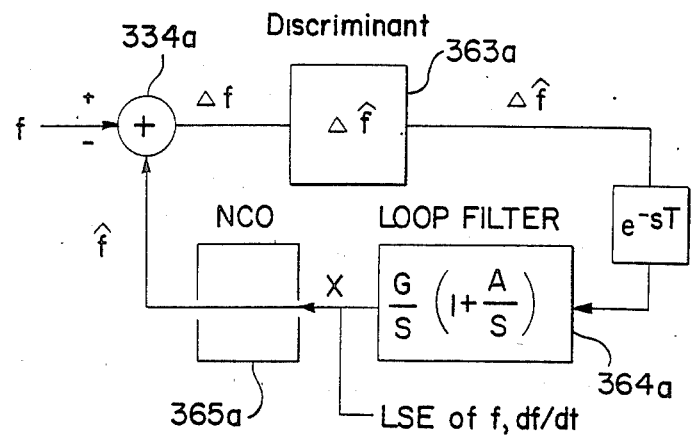
FIG. 14 is a schematic block diagram illustrating a circuit model of the frequency lock loop of the preferred embodiment.

These notations may be understood by reference to FIG. 14a–f. FIG. 14a illustrates encoded Manchester data symbols "1" and "0" as a function of time. In FIG. 14b, the tracking filters $C_2(1)$, $C_2(2)$, $C_2(3)$ are shown formed over three consecutive Manchester bits. FIGS. 14c–f illustrate and define the four transition detection filters $C_{up}(1)$, $C_{dn}(1)$, $C_{up}(2)$, $C_{dn}(2)$.

The AR test uses the relationship described in Equation 28.

$$-\lambda_c C1(K+1) - (C2(K+1)\lambda_c \quad (28)$$

where $C1(K+1) - C2(K+1) = \psi_{AR}$ defined in Equation 27, and $\lambda_c$ = counter threshold.

If $\psi_{AR} > \lambda_c$, then the decision is that AR is valid and the SLL is tracking the bit transition. If $\psi_{AR} < -\lambda_c$, then the decision is that AR is valid, and the SLL is tracking the mid-bit transition. Otherwise, the result of the test is that there is no AR decision, and the AR test will be continued if there is no mode timeout.

The AR parameters that implement this AR relationship are the detection filter threshold and the counter threshold $\lambda_c$.

The AR detection filter threshold $\lambda$ is a function of the $C/N_o$ and the bit transition rule. In the preferred embodiment, $\lambda = \sqrt{2} < |C_2| >$ was selected. The counter threshold value $\lambda_c = 50$ was selected, and provides adequate AR times with low false alarm rates at low bit transition rates (BTR).

AR During PLL Mode

During the PLL mode, the AR operates as a lock detector and differs from the AR operation of the FLL/SLL mode only in the decision rule. The same AR decisioning statistic $\psi_{AR}$ is used as in the FLL/SLL mode. One difference in the decision rule is that the $\psi_{AR}$ is accumulated over an eight second period before an AR test is made of the lock detector tests, which means that $(K+1)$ equals (8 seconds) x (256 symbols/second) equals 2048 when the test is made. Another difference in the decision rule is that $\psi_{AR}$ is only compared to the positive threshold 188$* < |C_2| >$ to decide if the AR is still "in lock," i.e., still tracking the mid-bit transitions. The threshold constant 188 is considerably larger than the value 50 used during the FLL/SLL mode, because of the longer accumulation time for $\psi_{AR}$, and the desire to have a very low probability of false alarm ($P_f$) or false indication of lock" status. In the PLL mode, an "out-of-lock" decision must be confirmed by the next eight second AR test to be considered valid, whereas in the FLL/SLL mode, two chances are provided to confirm the AR decision.

Receiver Mode Control

Figure 12A:
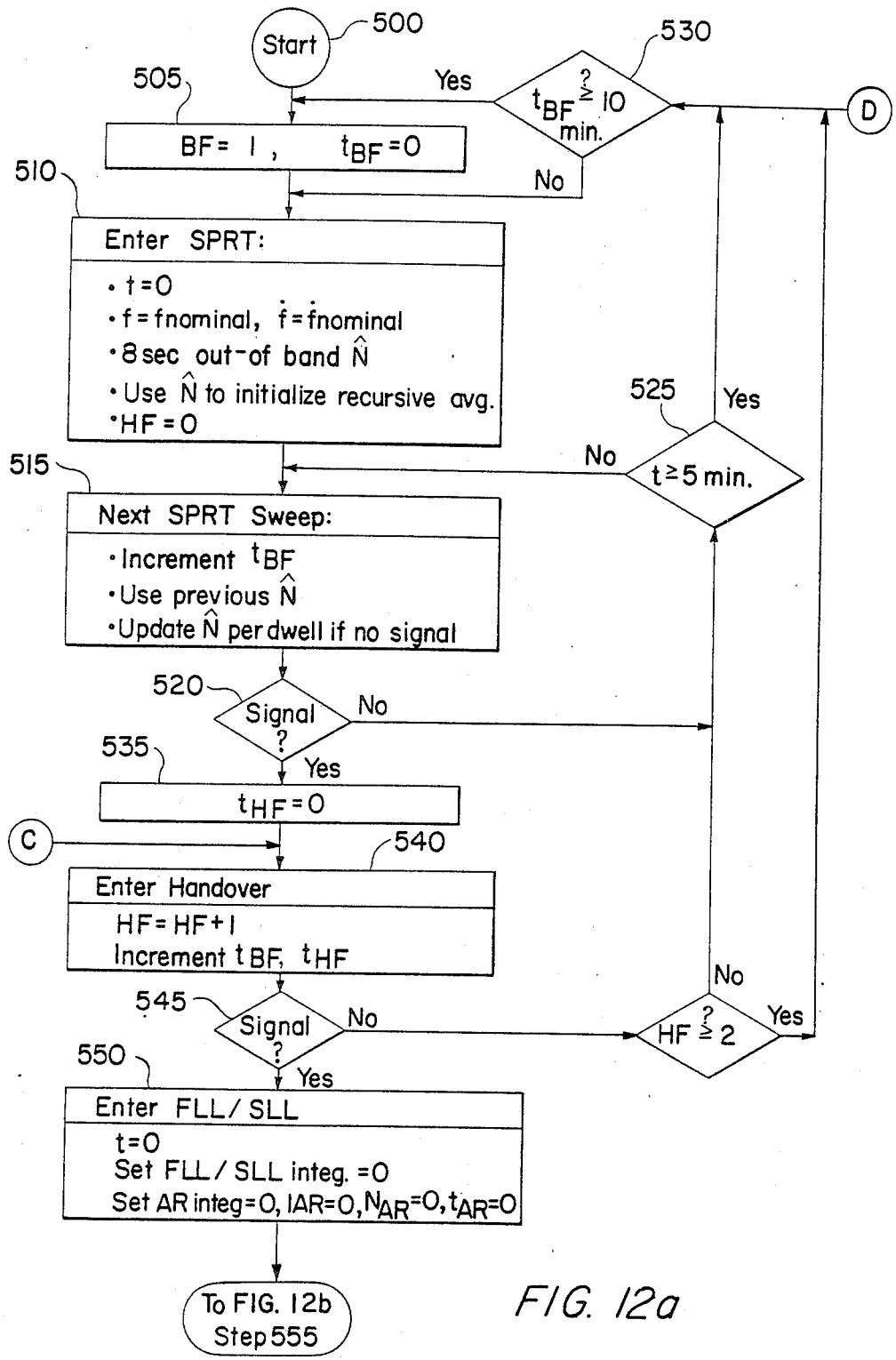
FIGS. 12a–12e are flow charts illustrative of the receiver mode cntrol system of the preferred embodiment.

Referring to FIG. 12a, detailed diagram of the mode control operation of the receiver is illustrated. At starting point 500, the receiver starts its operation. At step 505, flag BF is set to the value 1, and the mode control timer $T_{BF}$ is set to 0.

At step 510, the SPRT mode is entered. The SPRT timer T is set to 0, the estimate of the signal frequency f and frequency rate $\dot{f}$ are set to their nominal values. The out-of-band noise energy estimate $\hat{N}$ is calculated for an eight second integration period, and used to initialize the one step recursive average. The handover counter HF is set to 0.

At step 515, the next SPRT sweep occurs through the frequency uncertainty range. The mode control timer $t_{BF}$ is incremented, the DFT filters are formed and the energy accumulations are calculated using the present N value. At step 520, the threshold test described above occurs, and if no signal is deemed present, then the N value is updated, and the mode control proceeds to step 525, where the SPRT timer t is checked to determine if it has exceeded five minutes. If not, step 515 is repeated for another SPRT sweep. If at step 525, the SPRT timer value exceeds five minutes, then it is deemed necessary to obtain another estimate of the out-of-band energy $\hat{N}$ and thus the mode control proceeds to step 530.

At step 530, the mode control timer $t_{BF}$ is tested to determine whether its value is greater than or equal to ten minutes. If so, then the mode control proceeds back to step 505 to reinitialize the timer. If $t_{BF}$ is less than ten minutes, then the program enters SPRT routine at step 510.

If the SPRT threshold test indictes at step 520 that the signal is present within the uncertainty region, then at step 535 the handover timer $t_{HF}$ is set to zero. At step 540, the mode control timer $t_{BF}$ and the handover timer $t_{HF}$ are incremented, and the handover counter HF is incremented.

At step 545, the Neyman-Pierson test (NP test) is performed as a check to determine whether a false alarm has been given by the SPRT that a signal is present. If the NP test indicates that no signal is found, then the mode control proceeds to step 548 where the value of the handover flag HF is checked if its value is greater than or equal to 2. If not, then the mode control goes to step 525, and thence either to step 515 or 530. If the value of the handover flag HF is greater than or equal to 2, then step 530 is entered.

If the NP test indicates the signal has been found, then the FLL/SLL is entered at step 550. The FLL/SLL timer is set to zero, and the FLL/SLL integration registers are set to zero. Also, in this step the ambiguity resolution (AR) integrators are set to zero, flag IAR is set to zero, as are AR counter $N_{AR}$ and timer $t_{AR}$.

Figure 12B:
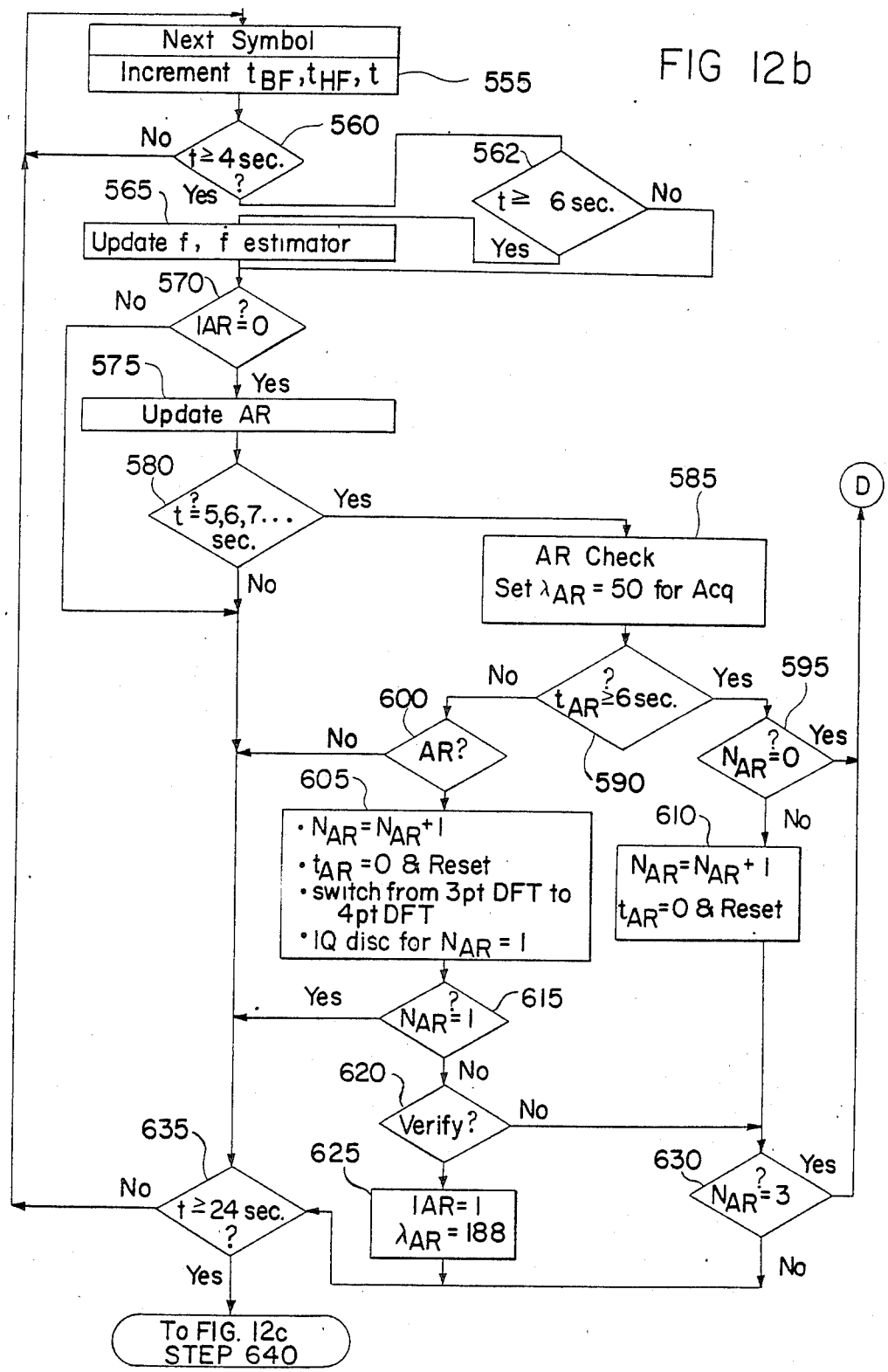
Figure 12C:
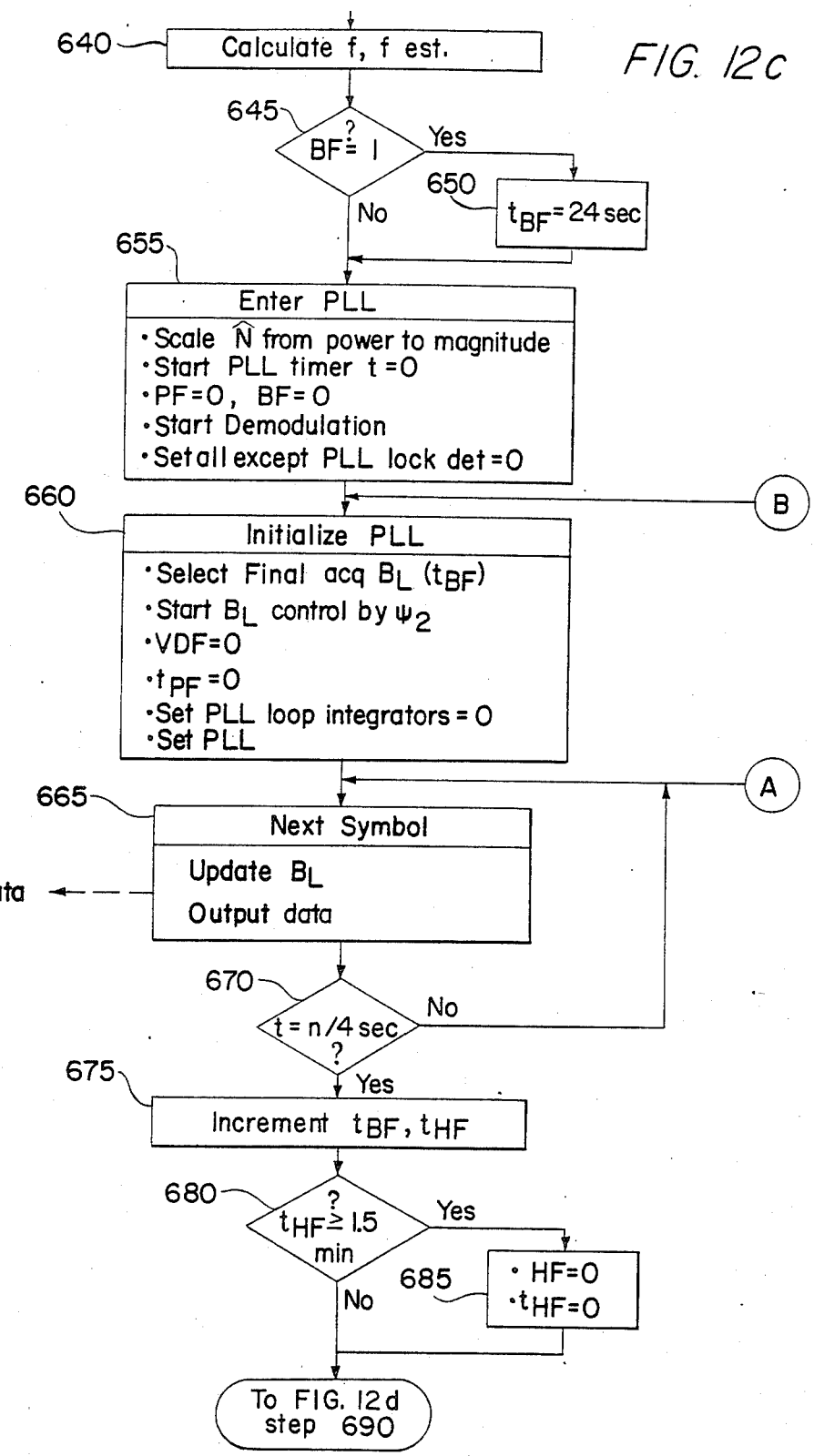
Figure 12D:
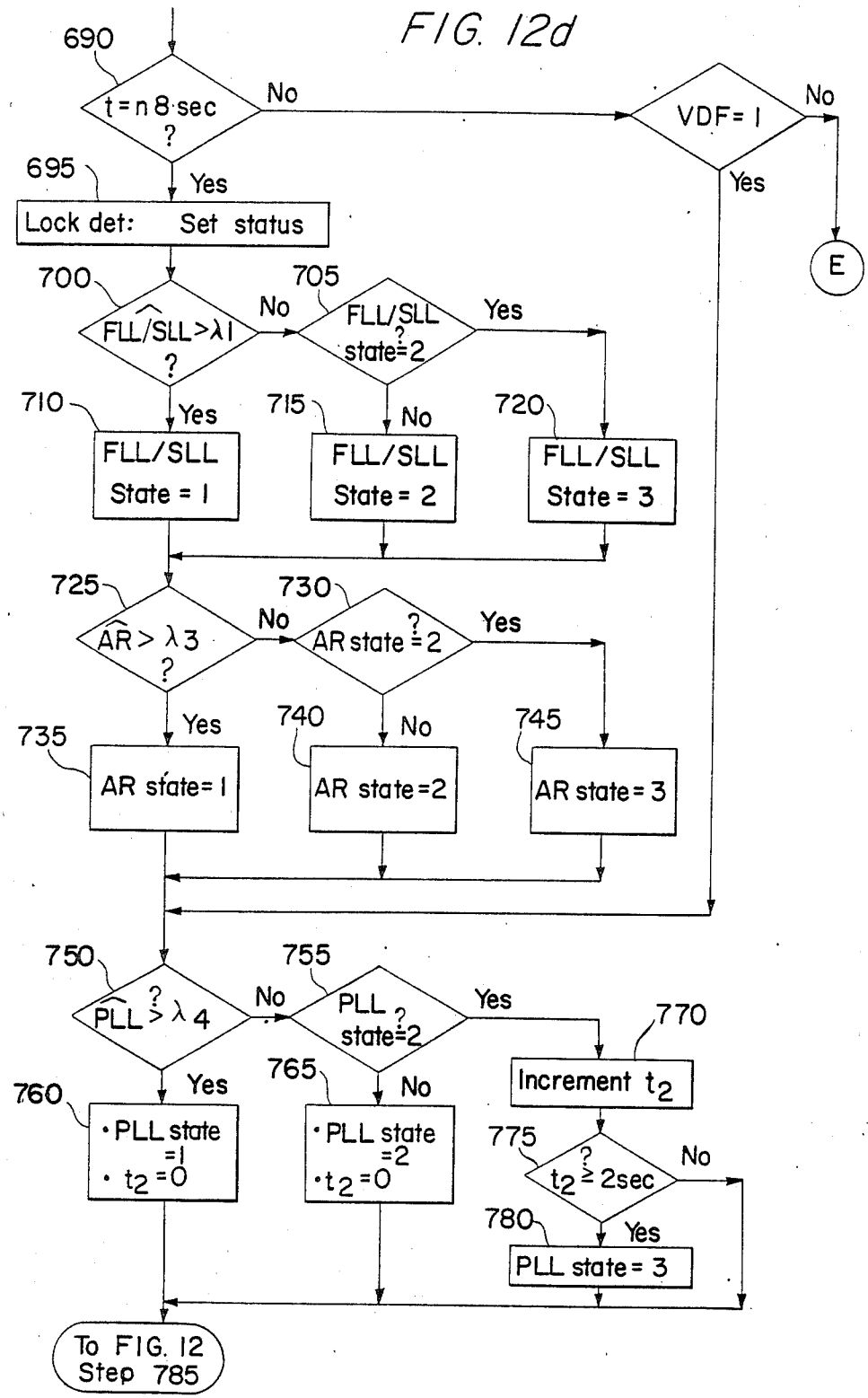

Referring now to FIG. 12b at step 555, the next symbol is processed during the FLL/SLL, and the mode control timer $t_{BF}$, the handover timer $t_{HF}$ and the FLL/SLL loop timer t are incremented. At step 560, the FLL/SLL timer t is tested to determine whether its value is greater than or equal to four seconds. If not, then the mode control loops back to step 555. If the timer value is greater than or equal four seconds, then at step 562, the FLL/SLL loop timer t is checked to determine whether it is greater than or equal to six seconds. If not, step 565 is bypassed. If "yes;" then at step 565, the estimated values for frequency f and rate of frequency change $\dot{f}$ are updated. At step 570, a decision is made to determine whether the flag IAR equals zero. This flag indicates the state of the FLL/SLL lock detectors, i.e., whether the FLL/SLL are "in lock" or "out-of-lock." If the state of IAR equals zero, then at step 575, and at step 580 the FLL/SLL timer t is checked to determine whether its value is greater than or equal to five seconds. If so, then the ambiguity resolution check routine is entered at step 585.

At step 585, the value of $\psi_{AR}$ is set to 50 for acquisition. At step 590, the ambiguity resolution timer $t_{AR}$ is checked to determine whether its value is greater to or equal to six seconds. If it is not, then at step 600 a decision occurs to determine whether ambiguity has been resolved. If not, then the mode control continues to 635. If at step 600 the ambiguity has been resolved, then at step 605 the ambiguity resolution counter $N_{AR}$ is incremented by 1, timer $t_{AR}$ is set to zero and reset, the DFT operation is switched from 3-point DFT to 4-point DFT filter operation, and the discriminant for the determination of $\Delta f$ is changed to the IQ discriminant for $N_R$ equals 1. At step 615, a decision is made to determine whether the $N_{AR}$ counter equals 1, indicating that ambiguity resolution has occurred. If $N_{AR}$ is 1, then the mode control proceeds to step 635. If the $N_{AR}$ counter does not equal 1, then at step 620 the ambiguity resolution is verified. If the result of the test is negative, then the mode control goes to step 630. At step 630, the value of counter $N_{AR}$ is checked for equality to 3, indicating that ambiguity resolution has occurred and has not been verified after two attempts. If $N_{AR}=3$, then mode control branches to D shown in FIG. 12a. If the verification is positive at step 620, then at step 625 the value of IAR is set to 1, and the value for $\psi_{AR}$ is set to 189.

At step 635, the FLL/SLL timer t is checked to determine whether its value is greater than or equal to 24 seconds. If not, then the mode control reverts to step 555. If the timer is greater than or equal to 24 seconds, then the FLL/SLL mode is exited and the mode control proceeds to FIG. 13c.

At step 640, the estimates for f and $\dot{f}$ are calculated. At the end to step 645, a decision is made to determine whether the flag BF is equal to 1, indicating that the receiver operation has proceeded through the SPRT, FLL/SLL and handover. If BF =1, then at step 650 the mode control timer $t_{BF}$ is set to 24 seconds and program control proceeds to step 655. If at step 645 the flag BF does not equal zero, then step 655 follows immediately.

At step 655, the phase-lock loop (PLL) is entered. During this step, the value $\hat{N}$ is scaled from a power an amplitude basis, the PLL timer is set to 0. Flag PF and BF are set to 0. The demodulation operation commences also, although the data is not valid. All lock detectors states are set to 0, except the PLL lock detector. At step 660, which can also be entered via "B," the phase-lock loop is initialized by selection of the final acquisition noise bandwidth $B_L$, and the control of the bandwidth by the $\psi_2$ factor is commenced. Flag VDF is set to 0. The PLL timer t is set to 0, as are the PL loop integrators and lock-detector states.

At step 665, the next symbol is processed by the phase-lock loop. The bandwidth $B_L$ is updated; valid data is demodulated and output; and the lock-detector calculation is updated. At step 670, a decision is made to determine whether the phase-lock loop timer t is equal n/4 seconds where n is an integer. At every ¼ second interval, that is, every 64th symbol, a lock-detector test is performed. If the result of the decision is negative, then receiver operation reverts to step 665 to process the next symbol. If the result of decision point 670 is positive, indicating that a lock-detector test should be performed, then at step 675 the values for the mode control clock $t_{BF}$ and the handover clock $t_{HF}$ are incremented. At step 680, the value of the handover clock $t_{HF}$ is tested to determine whether it is greater than or equal to 1½ minutes. If it is, then at step 685 the handover counter HF is set to 1, and the handover clock $t_{HF}$ is set to 0. Receiver operation then proceeds to step 690 shown in FIG. 13d.

Step 690 comprises a decision point to determine whether the phase-lock loop timer $t=n\cdot 8$ seconds where n is an integer. The purpose of this test follows from the fact that every eight seconds, all of the lock-detectors, are checked. If t does not equal n·8, then at step 692 a test is performed to determine whether the value of flag VDF equals 1. If not, then the program proceeds to step E (FIG. 13e) indicating the PLL is still in the acquisition mode. If VDF=1, then the receiver operation proceeds to step 750 to test the PLL lock status.

If at step 690 t=n·8, then operation proceeds to step 695 which is to set the status of the lock-detectors. Step 700-720 implement the lock-detector tests 2-5 decribed hereinabove. Step 700 comprises a decision to determine whether the FLL/SLL test statistic is greater than or equal to $\lambda_1$. If not, then at state 705 the FLL/SLL state is checked to determine whether it equals 2. If it does, then at step 720 this state is set equal to 3 and program control proceeds to step 725 indicating that the "loss-of-lock" has been verified by the next eight second test. If the FLL/SLL state does not equal 2 at step 705, then at step 715 it is set equal to 2. If at step 710 the FLL/SLL test statistic does exceed $\lambda_1$, the FLL/SLL state is set equal to 1, and program control proceeds to step 725.

At steps 725-745, lock-detector test number 6 is implemented as described hereinabove. At step 725, the ambiguity resolution discriminant is checked to determine whether it is greater than $\lambda_3$. If it is not, then at step 30 the state of the ambiguity resolution is checked to determine it equals 2. If it does, then at step 745 the AR state is set equal to 3 and the program control proceeds to step 750. If the result of decision point 730 is negative, then AR state is set equal to 2 at step 740. Finally, if at step 725 the AR discriminant does exceed $\lambda_3$, then at step 735 the AR state is set equal to 1.

At steps 750-780, lock-detector test number 1 described hereinabove is implemented. At step 750, the PLL test statistic is checked to determine whether it is greater than $\lambda_4$. If not, then at step 755 the PLL state is checked to determine whether it equals 2. If so, then at step 770, $t_2$ is incremented and at step 755 it is checked to determine whether it equals or is greater than two seconds. If not, then receiver operation proceeds to step 785 at FIG. 13e. If $t_2$ is greater than or equal to two seconds, then at step 780 the PLL state is set equal to 3 and the operation proceeds to step 785. If at step 755 the PLL state does not equal 2, then at step 765 the PLL state is set to 2 and timer $t_2$ is set equal to 0. Finally, at step 760 if the PLL test statistic is greater than $\lambda_4$ at step 750, then at step 760 the PLL state is set equal to 1 and the timer $t_2$ is set equal to 0.

Referring now to FIG. 13e, at step 785, the states of all lock-detectors are checked to determine whether they each equal 1. If not, then the program proceeds to step 795; but if all lock-detector states equal 1, then at step 790 the values for the noise estimate $\hat{N}$ and frequency estimate $\hat{f}$ are updated.

At step 795, the FLL/SLL state is checked to determine whether it equals 3. If it does, then the operation proceeds to point "D" in FIG. 13a.

At step 815, the ambiguity resolution state is checked to determine whether it equals 3. If it does, then the operation proceeds to step 805. If not, the operation loops to step 820, which checks to determine whether the PLL state equals 3. If yes, then at step 825 the flag PF is checked to determine whether it is greater than or equal to 2. If yes, then the program proceeds to step 805, and if not, the program proceeds to B. At step 830, the timer tPF is incremented and at step 835 its value is checked to determine whether it is greater than or equal to ten seconds. If it is, then at step 840 the flag PF is set equal 1 and timer PF is set equal to 0. At step 845, the mode control timer $t_{BF}$ is checked to determine whether it is greater than or equal to three minutes. If it is, then at step 850 the timer is set equal to three minutes and the operation proceeds to step "A." If the result of decision point 845 is negative, then the operation does proceed also to point "A."

Figure 12E:
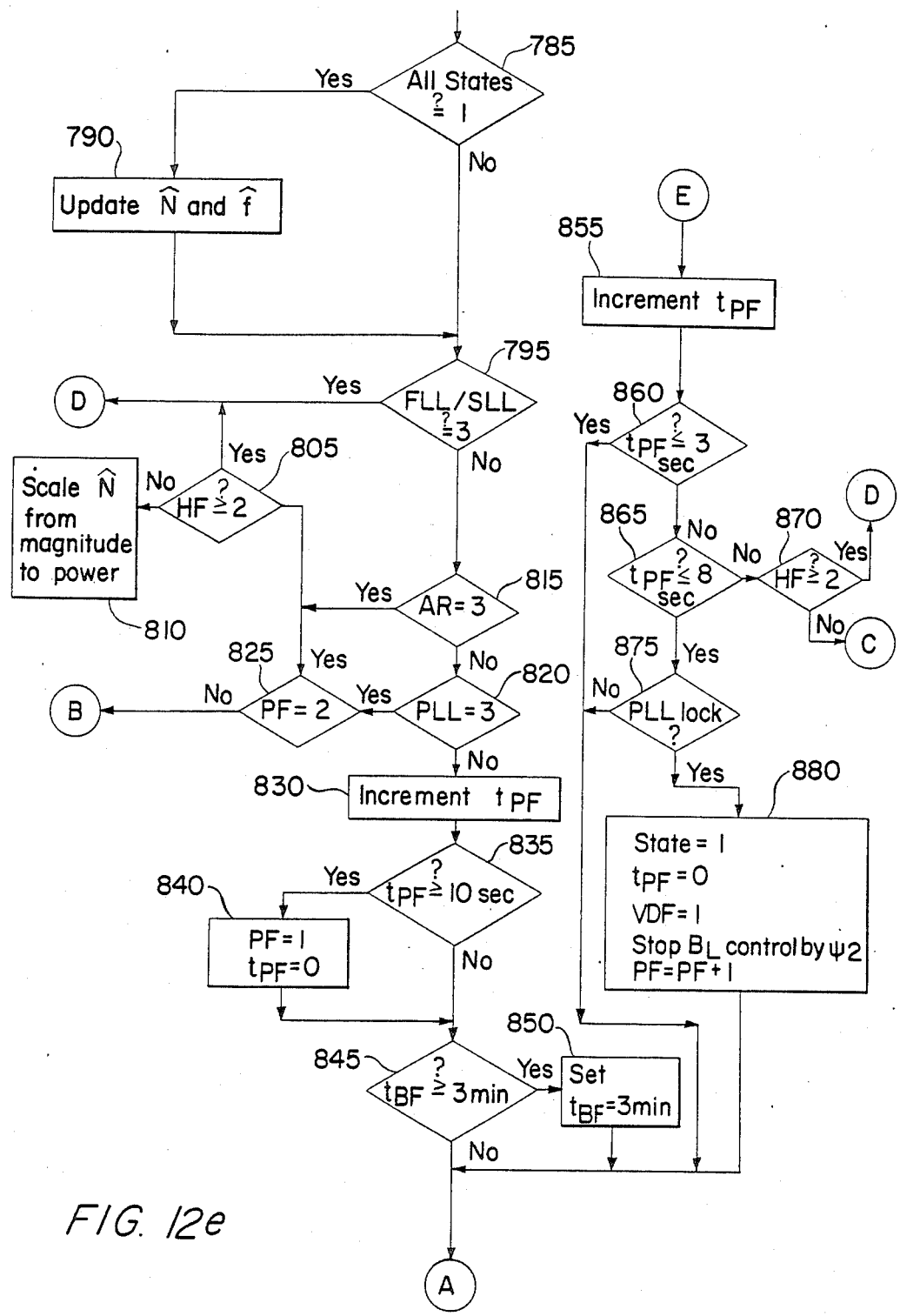

PLL acquisition indicated by mode "E," also described in FIG. 12e, starts with step 855, incrementing timer $t_{PF}$. At step 860, timer tPF is checked to determine whether it is less than or equal to three seconds. If yes, then the receiver operation proceeds immediately to point "A." If no, then at step 865, timer $t_{PF}$ is checked to determine whether it is less than or equal to eight seconds. If not, then at step 870 the flag HF is checked to determine whether it is greater than or equal to 2. If yes, then the program proceeds to routine "D," and if no, the operation proceeds to point "C." At step 875, the status of the PLL lock-detector is checked to determine whether PLL lock exists. If no, the operation proceeds to point "A." If the result of step 875 is positive, then at step 880 the PLL state is set equal to 1; the timer $t_{PF}$ is set to 0; flag VDF is set to 1; and the bandwidth control is switched from being contolled by the factor $\psi_2$, to a time control. Finally, in step 880 the flag PF is incremented by integer 1.

The mode control system of the preferred embodiment is implemented within the digital processor of the receiver. The processor program which implements the controller follows the detailed flow chart described in FIG. 12, and includes the calculations described above with respect to the various modes of receiver operation. Since further details of the program per se form no part of the present invention and since the program may be implemented in many different ways as is well known to those skilled in the art, the actual program will not be described further. The actual programming details will be readily apparent to those skilled in the art.

It will be seen that the receiver employing the mode control system is sequenced through its various modes of operation in an efficient manner, and in the case of "loss-of-lock," the mode control system determines the appropriate restart point to minimize the signal reacquisition time. For example, the most typical out-of-lock condition will be loss of phase lock. In this event, it is generally not necessary to start at the beginning of the mode control operation, i.e., with the SPRT calculations, or even to repeat frequency and symbol timing acquisition.

There has been described in this application a novel receiver for acquiring and tracking a data communications signal which is at a frequency within a predetermined uncertainty frequency band. With the receiver of the preferred embodiment, acquisition occurs within a short time and the signal may be tracked even in the presence of severe link stresses.

It is understood that the above-described embodiments are merely illustrative of but a small number of the many possible specific embodiments which can represent applications of the principles of the present invention. Numerous and varied other arrangements can be readily devised in accordance with these principles by those skilled in the art without departing from the spirit and scope of the present invention.

What is claimed is:

1. In a communications receiver, a method for acquiring a modulated data signal having a signal frequency within a frequency uncertaininty band, comprising the steps of:
   determining a coarse estimate of the spectral location of the data signal within the uncertainty band;
   determining a coarse estimate of the timing of data symbols modulated on the data signal;
   using said coarse estimates of the spectral location and the symbol timing, synchronizing the receiver operation with the frequency of the signal and the timing of symbols modulated on the signal;
   determining an improved estimate of the signal frequency and an estimate of the rate of change of the signal frequency;
   using said improved frequency estimate and said rate of change estimate, synchronizing the receiver operation to the phase and symbol timing of the data signal;
   confirming that frequency, phase and symbol timing have been achieved; and
   demodulating the data signal.

2. The method of claim 1 further comprising the initial step of determining an estimate of the noise power is used in the step of determining a coarse estimate of the spectral location of the signal.

3. The method of claim 1 further comprising the step of periodically confirming that valid data demodulation is occuring.

4. The method of claim 3 further comprising the step of adaptively determining the appropriate receiver operation restart point after determining that valid data demodulation is not occuring, said step adapted to minimize the signal dropout time which comprises the interval between the occurance of such an occurrence and valid data demodulation.

5. The method of claim 1 wherein said step of determining a coarse estimate of the spectral location comprises:
   (i) determining an estimate of the noise power;
   (ii) scanning the frequency uncertainty band in discrete frequency windows, utilizing a sequential probability ratio test (SPRT) employing said noise power estimate to find the presence of the signal within the frequency window;
   (iii) repeating the frequency scan until a signal is found within a discrete frequency window or until a predetermined time interval has elapsed; and
   (iv) upon elapsement of the predetermined time interval without locating the signal, restarting the receiver operation at step (i).

6. The method of claim 5 wherein said step of determining a coarse estimate of the spectral location further comprises;
   (v) if a signal is found within a discrete frequency window, verifying that a signal does or does no exist within the frequency window using a Neyman-Pearson test, and
   (vi) if the verification test indicates that a signal does not exist within the frequency window, repeating steps (ii)–(iv).

7. The method of claim 1 wherein said data signal is modulated with Manchester coded binary phase shift keyed modulation, and said step of synchronizing the receiver operation with the frequency of the signal and the timing of symbols modulated on said data signal comprises:
   (i) determining whether the symbol timing has resolved the ambiguity between symbol timing lock on the true symbol transition or Manchester midbit transition;
   (ii) if the ambiguity has not been resolved, determining whether a predetermined time interval has elapsed since commencing said steps; and
   (iii) if the time interval has elapsed, restarting said method at said step of determining a coarse estimate of the spectral location of the signal.

8. The method of claim 1 wherein said step of synchronizing the receiver operation to the phase and symbol timing of the data signal comprises:
   (i) determining whether the phase lock loop (PLL) is the in the lock state or the out-of-lock state;
   (ii) if the PLL is in the out-of-lock state, determining whether such state has existed for a predetermined time interval;
   (iii) in the event the out-of-lock condition has existed for such predetermined time interval, repeating said step of determining a coarse estimate of the spectral location of the data signal.

9. The method of claim 3 wherein said step of confirming that valid data demodulation is occurring comprises
   (i) determining whether the receiver is tracking the signal at a false frequency or time offset;
   (ii) if the receiver is tracking the signal at a false frequency or time offset, determining whether such condition has existed for longer than a predetermined first time interval; and
   (iii) if such condition has not existed for an interval longer than such predetermined first time interval, restarting receiver operation at said step of synchronizing the receiver operation to the phase and symbol timing of the data signal.

10. A receiver adapted to acquire and track a modulated data signal having a frequency within a frequency uncertainty band, comprising;
    noise estimating means for estimating the noise energy level;
    coarse spectral estimating means for responsive to said noise estimating means for determining a coarse estimate of the spectral location of the data signal within the uncertainty band;
    means responsive to said noise estimating means for determining a coarse estimate of the timing of data signals modulated on the data signal;

first synchronizing means responsive to said coarse estimates of the spectral location and timing for synchronizing the receiver operation with the frequency of the signal and the timing of symbols modulated on the signal and for determining an improved estimate of the signal frequency and an estimate of the rate of change of the signal frequency;

second synchronizing means responsive to said improved signal frequency estimate and said rate of change estimate for synchronizing the receiver operation to the phase and symbol timing of the data signal;

means for confirming that synchronization of receiver operation to the frequency, phase and symbol timing of the data signal has been achieved;

means for demodulating the signal;

verifying means for periodically verifying said receiver operation synchronization, and;

digital processor means for controlling the receiver operation to acquire said data signal, said processor means for operating the receiver to:

(i) provide an estimate of the noise energy level;

(ii) in a scan mode, employ said noise estimate to determine a coarse estimate of the signal frequency within the uncertainty band;

(iii) in a handover mode, utilize said coarse estimate to provide a first improved estimate of the signal frequecny and a coarse estimate of the symbol timing;

(iv) in a frequency and symbol locking mode, employing said first improved estimate of the symbol frequency and said symbol timing estimate to synchronize the receiver with the frequency of the signal and the timing of symbols modulated on the signal and to provide a second improved estimate of the signal frequency and an estimate of the rat of change of the signal frequency; and (v) in a phase locking mode, utilizing said second improved estmiate of the frequency and said estimate of the frequency rate of change to phsae lock the receiver operation to the data signal to allow valid data demodulation.

11. The receiver of claim 10 wherein said noise estimating means comprises means for measuring the spectral energy at frequency locations outside such frequency uncertainty band.

12. The receiver of claim 10 wherein said coarse spectral estimating means comprises means adapted to perform sequential ratio probability testing (SPRT) on discrete frequency windows within said uncertainty band.

13. The receiver of claim 10 wherein said first synchronizing means comprises frequency lock loop means.

14. The receiver of claim 13 wherein said first synchronizing means comprsises means for determining a least squares estimation of frequency estimates determined during the frequency lock loop operation, said least squares estimation comprising said improved estimate of the signal frquency.

15. The receiver of claim 10 wherein said verifying means comprises means for determining whether the receiver is tracking the signal at a false frequency or time offset.

16. The method of claim 1 further comprising the steps of:

periodically determining whether the receiver operation is locked to the phase, frequency and symbol timing of the data signal; and in the event the receiver is determined to no longer be locked to the phase, frequency and symbol timing, adaptively determining an appropriate restart point in the receiver operation.

17. The method of claim 16 wherein said step of adaptively determining the appropriate receiver restart point comprises:

timing the length of time for which the out-of-lock condition has existed; and if said time interval is less than a predetermined first time period, restarting the receiver operation of said step of synchronizing the receiver operation at said step of determining a coarse estimate of the spectral location of the data signal.

18. The receiver of claim 13 wherein said first synchronizing means comprises symbol lock loop means.

19. In a digital processor controlled data communications receiver operable in highly stressed environments, a method for acquiring and tracking a modulated data signal having a signal frequency uncertainty bandwidth, comprising a sequence of the following steps:

in a scan mode, sequentially evaluating the signal energy within a plurality of frequency band windows comprising the uncertainty bandwidth to determine the frequency band window in which the signal is located;

in a handover mode, determining coarse estimates of the frequency of the signal within the determined window and of the timing of the data symbols modulated on the data signal;

in a frequency and symbol lock loop mode, using said coarse estimates of the frequency and symbol timing to lock the receiver operation to the frequency of the data signal and the timing of such data signals and to determine an irproved estimate of the signal frequency and an estimate of the rate of change of the signal frequency;

in a phase lock and symbol lock loop mode, using said improved estimate of the signal frequency and the estimate of the rate of change of the signal frequency to lock the receiver operation to the phase and to the symbol timing of the data signal; and demodulating the data signal.

20. The method of claim 19 further comprising the initial step of determining an estimate of the spectral noise power, and wherein said estimate of the noise power is used in said scan mode to determine the frequency band window in which the signal is located.

21. The method of claim 20 wherein said sequential evaluation step in said scan mode comprises a sequential probability ratio test (SPRT) performed on spectral energy accumulations formed from spectral components within a particular frequeuncy window, and wherein said SPRT is performed sequentially for each of the respective wiadows comprising said uncertainty bandwidth until a signal is found within a frequency window, and repeating said scan of the frequency uncertainty bandwidth until the signal is located or until a predetermined time interval has elapsed, and upon elapsement of said predetermined time interval without location the signal, restarting the receiver operation at said initial step of determining an estimate of the noise power.

22. The method of claim 21 wherein said handover mode further comprises the step of verifying that a signal exists within said determined window using a Neyman-Pearson test.

23. In a communications receiver comprising a programmed digital processor for carrying out a programmed sequence of instructions, a method for acquiring and tracking a modulated data signal within a frquency uncertainty bandwidth, comprising a sequence of the following steps:

(a) determining an estimate of the spectral noise power;

(b) in a scan mode, sequentially evaluating the spectral energy content in a predetermined frequency windows comprising said frequency uncertainty bandwidth by forming a plurality of digital filters over said respective frequency windows and performing a sequential probability radio test on the energy accumulations to find the presence of the signal in a particular frequency window, said test employing said noise power estimate;

(c) once a signal has been located in a particular frequency window, switching the receiver operation to handover mode to determine a first imporved estimate of the location of the signal frequency within said particular frequency window and an estimate of the data symbol timing by forming a plurality of digital filters over said particular frequency window at particular frequency and time offsets, accumulating signal energies in said filsters and selecting a particular frequency and time offset in said frequency window to determine said first improved estimate of the signal frequency and the estimate of symbol timing;

(d) in a frequency locking and symbol locking mode (i) using said estimate of the frequency to frequency lock a frequency lock feedback loop (FLL) to the data signal, (ii) using said estimate of symbol timing to lock a symbol timing feedback loop (SLL) to the timing of the data symbols, and (iii) determining a second improved estimate of the signal frequency and an estimate of the signal frequency rate of change from the operation of said FLL; and (e) in a phase and symbol timing locking mode, using said second improved frequency estimate and said rate of change estimate to phase lock a phase lock feedback loop (PLL) to the phase of said modulated data signal.

24. The method of claim 23 wherein, during said scan mode, said frequency windows are sequentially evaluated during a scan of the uncertainty bandwidth and the scan mode is repeated until said data signal is located or until elapsement of predetermindd time interval, whereupon the receiver operation is restarted at step (a).

25. The method of claim 24 wherein, during successive scans of said frequency uncertainty bandwidth during said scan mode, said digital filters are offset in frequency and time from their respective location during the preceding scan.

26. The method of claim 23 wherein said frequency locking and symbol locking mode is completed in a predetermined time interval, and said frequency locking step comprises a frequency acquisition mode during a first part of said time interval and a frequency tracking mode in a second part of time interval, wherein during said acquisition mode a first FLL discriminant is employed to lock the frequency locking loop to the frequency of the data signal, and during the tracking mode a second FLL discriminant is employed to track the frequency and generate said second improved frequency estimate and said estimate of the frequency rate of change.

* * * * *